United States Patent
Fukuda

(10) Patent No.: US 8,223,675 B2
(45) Date of Patent: Jul. 17, 2012

(54) INFORMATION PROCESSING APPARATUS AND DUPLEX TRANSMISSION METHOD

(75) Inventor: Kunio Fukuda, Tokyo (JP)

(73) Assignee: Sony Corporation, Tokyo (JP)

( * ) Notice: Subject to any disclaimer, the term of this patent is extended or adjusted under 35 U.S.C. 154(b) by 450 days.

(21) Appl. No.: 12/605,654

(22) Filed: Oct. 26, 2009

(65) Prior Publication Data

US 2010/0110939 A1    May 6, 2010

(30) Foreign Application Priority Data

Nov. 5, 2008  (JP) ................................. 2008-284355

(51) Int. Cl.
*H04L 5/14* (2006.01)
*H04J 3/06* (2006.01)

(52) U.S. Cl. ......... 370/276; 370/503; 375/375; 375/376

(58) Field of Classification Search .................. 370/276, 370/503, 516, 518; 375/359, 361, 375, 376
See application file for complete search history.

(56) References Cited

U.S. PATENT DOCUMENTS

| | | |
|---|---|---|
| 3,369,181 A | 2/1968 | Braymer |
| 3,993,867 A | 11/1976 | Blood, Jr. |
| 4,638,473 A | 1/1987 | Cooperman et al. |
| 2001/0017506 A1* | 8/2001 | Ettes et al. ................ 310/359 |
| 2002/0048323 A1* | 4/2002 | Kang et al. ............... 375/240.27 |
| 2002/0073352 A1* | 6/2002 | Okubo et al. ............. 713/600 |
| 2003/0194017 A1 | 10/2003 | Woodworth |
| 2010/0329381 A1* | 12/2010 | Shimizu et al. ............ 375/293 |
| 2011/0037759 A1* | 2/2011 | Fukuda ...................... 345/213 |
| 2011/0241432 A1* | 10/2011 | Nishioka et al. .......... 307/80 |

FOREIGN PATENT DOCUMENTS

| | | |
|---|---|---|
| EP | 0 157 704 A2 | 10/1985 |
| EP | 0 157 704 A3 | 10/1985 |
| EP | 1 705 824 A2 | 9/2006 |
| GB | 2 185 663 A | 7/1987 |
| GB | 2 242 105 A | 9/1991 |
| JP | 3-109843 | 5/1991 |
| JP | 2000-236359 | 8/2000 |

OTHER PUBLICATIONS

Office Action issued Nov. 3, 2011, in European Patent Application No. 09 175 010.9.

* cited by examiner

*Primary Examiner* — Andrew Lee
(74) *Attorney, Agent, or Firm* — Oblon, Spivak, McClelland, Maier & Neustadt, L.L.P.

(57) ABSTRACT

There is provided an information processing apparatus includes a first module and a second module. The first module includes a first signal generator that produces a first signal by coding a first transmitted data into a waveform not including a direct-current component, having a polarity being inverted in each half period of a clock; a first signal sending unit that sends the first signal; and a signal subtracting unit that subtracts the first signal from a received signal. The second module includes a clock detecting unit that detects the clock based on the polarity inverting period of the first signal received from the first module; a second signal generator that produces a second signal by coding a second transmitted data into a waveform not including the direct-current component; and a second signal sending unit that sends the second signal while the second signal is synchronously added to the first signal.

7 Claims, 19 Drawing Sheets

CIRCUIT CONFIGURATION EXAMPLE OF CLOCK DETECTING UNIT 332

CIRCUIT CONFIGURATION EXAMPLE OF CLOCK DECORDER 334

FIG. 12

DETERMINATION TABLE FOR DETERMINING (STORAGE UNIT 364)

| COMPARATOR 354 | COMPARATOR 356 | COMPARATOR 358 | COMPARATOR 360 | OUTPUT |
|---|---|---|---|---|
| 1 | 1 | 1 | 1 | 1 |
| 0 | 1 | 1 | 1 | 0 |
| 0 | 0 | 1 | 1 | 1 |
| 0 | 0 | 0 | 1 | 0 |
| 0 | 0 | 0 | 0 | 1 |

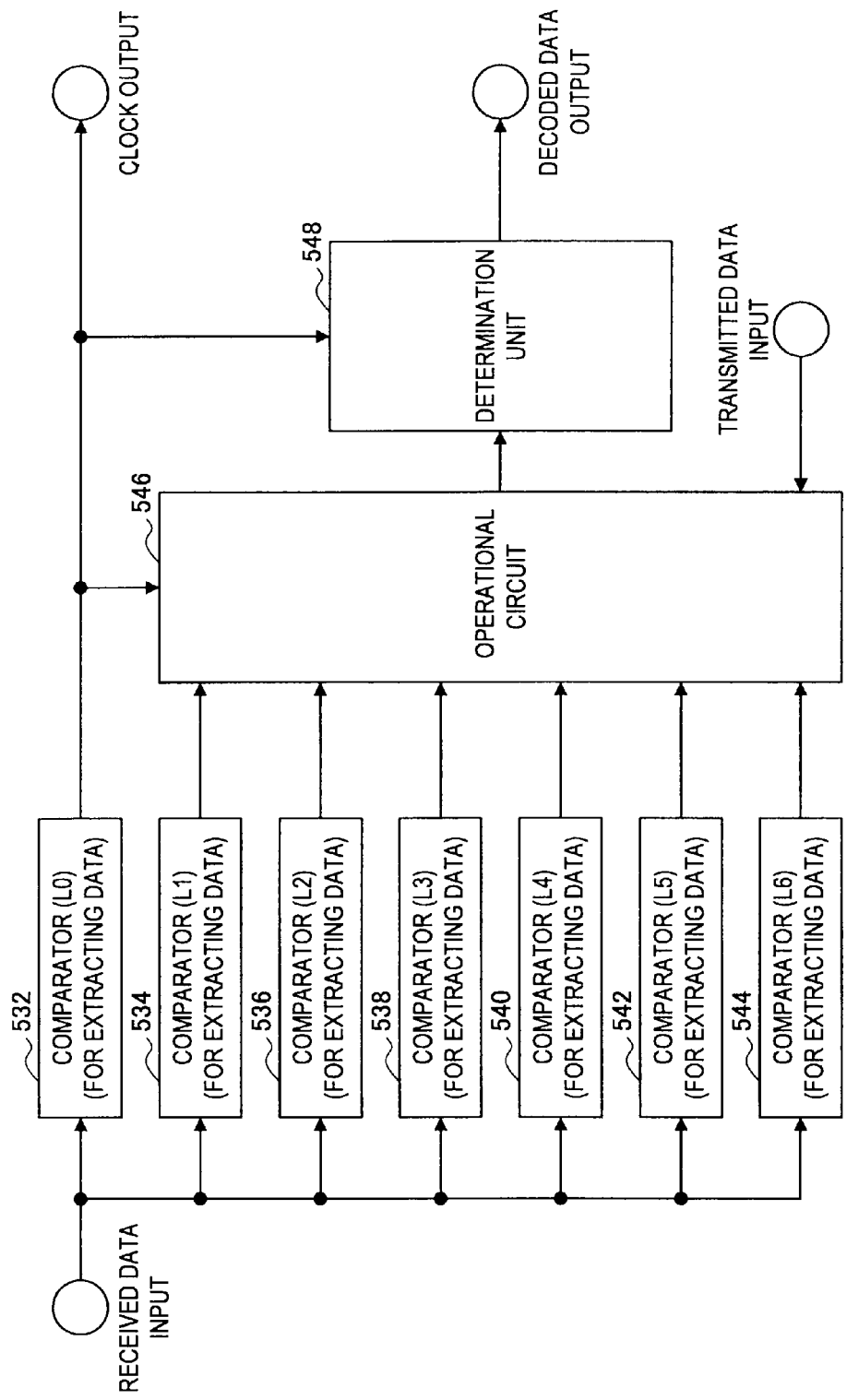

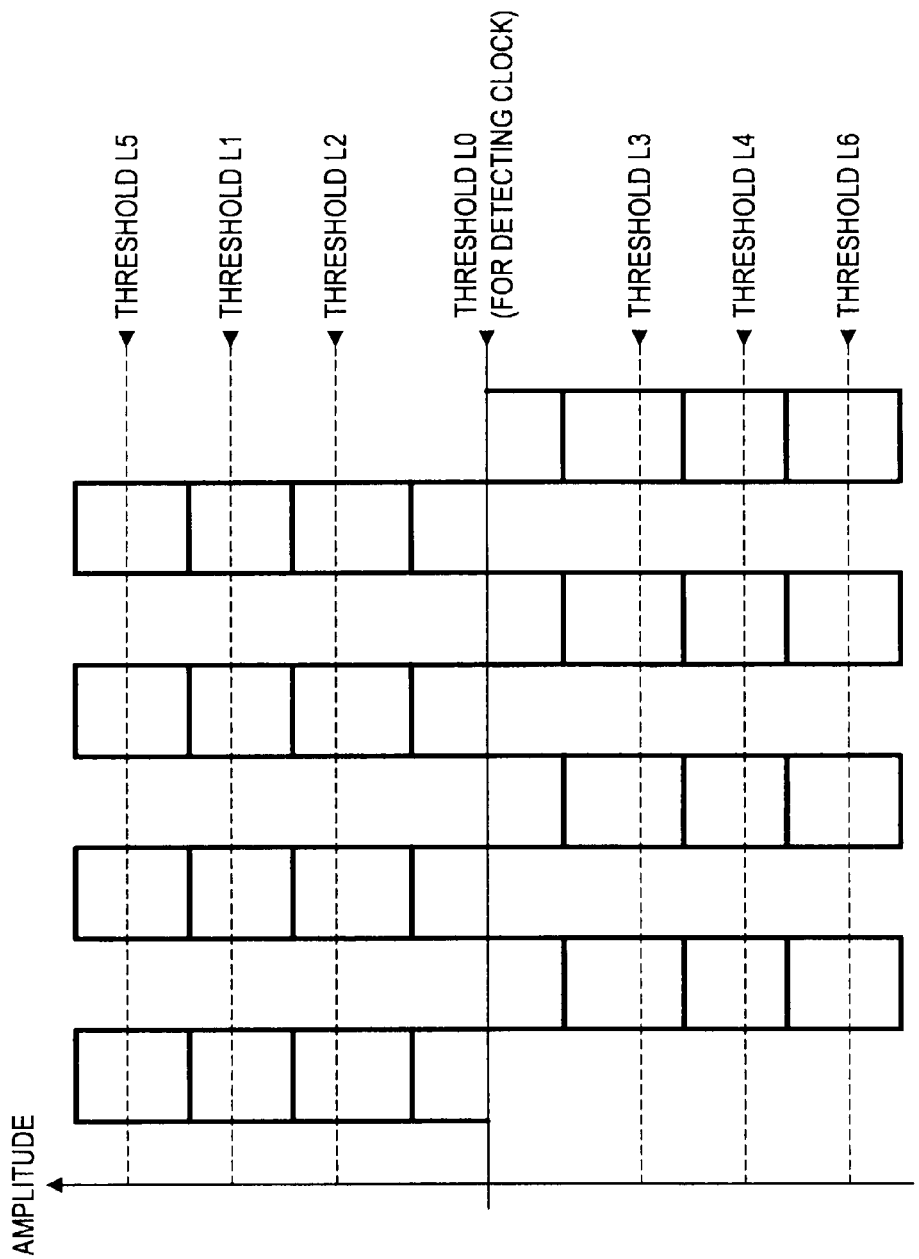

INFORMATION PROCESSING APPARATUS AND DUPLEX TRANSMISSION METHOD

BACKGROUND OF THE INVENTION

1. Field of the Invention

The present invention relates to an information processing apparatus and a duplex transmission method.

2. Description of the Related Art

In mobile terminals typified by a mobile telephone, a movable member is frequently used in a connection portion between a manipulation portion manipulated by a user and a display portion on which information is displayed. For example, a structure for opening and closing a foldable mobile telephone is a representative example of the movable member. In addition to a talking function and a mail function, a video image viewing function and an imaging function are incorporated in the recent mobile telephone. Therefore, the connection portion is demanded to be movable in a complicated way as usage of the user. For example, in cases where the video image viewing function is utilized, the user causes the display portion to face the user side while accommodating the manipulation portion unnecessary for the viewing. In cases where the mobile telephone is used as a normal telephone, in cases where the mobile telephone is used as a digital camera, or in cases where the mobile telephone is used as a television receiver, there is a demand for a structure in which the orientation and position of the display portion can easily be changed on each usage.

However, many signal lines and power lines are provided in the connection portion between the manipulation portion and the display portion. For example, tens lines are connected in parallel in the display portion (see FIG. 1). Therefore, when the movable member that can be moved in the complicated way is used as the connection portion, reliability of the lines is remarkably lowered. For this reason, a technique is shifted from a parallel transmission system to a serial transmission system (see FIG. 2) in order to decrease the number of lines of the connection portion. Obviously, for the similar reason, the technical shift is generated in not only the mobile telephone but also various electronic instruments in which complicated wiring is demanded. There is also another reason the serialization is advanced in order to reduce Electro Magnetic Interference (EMI).

In the serial transmission system, transmitted data is transmitted after coded by a predetermined system. Examples of the coding system include NRZ (Non Return to Zero) coding system, Manchester coding system, and AMI (Alternate Mark Inversion) coding system. For example, Japanese Patent Application Laid-Open No. 3-109843 discloses a technique of transmitting data by utilizing the AMI code that is of a typical example of a bipolar code. Japanese Patent Application Laid-Open No. 3-109843 also discloses a technique, in which a data clock is transmitted while expressed by an intermediate value of a signal level and the data clock is reproduced on the reception side based on the signal level.

SUMMARY OF THE INVENTION

In the coding systems, because a signal of the NRZ coding system includes a direct-current component, the signal of the NRZ coding system is hardly transmitted along with a direct-current component such as a power supply. On the other hand, because signals of the Manchester coding system and AMI coding system do not include the direct-current component, the signals of the Manchester coding system and AMI coding system can be transmitted long with the direct-current component such as the power supply. However, in the Manchester coding system and the AMI coding system, it is necessary to provide a PLL (Phase-Locked Loop) circuit on the reception side in order to reproduce the data clock of the signal. Therefore, a consumption current amount is increased because the PLL circuit is provided on the reception side. In the Manchester coding system, because the data is transmitted at a rising edge and a trailing edge of amplitude, it is necessary to transmit the data with a clock double a data rate. As a result, the consumption current is increased due to high-speed clock operation.

Therefore, there has been developed a technique in which the direct-current component is not included but a code, in which the PLL circuit is unnecessary in reproducing the clock, is generated and transmitted. In the technique, a first bit value is expressed by a plurality of first amplitude values with respect to input data including first and second bit values that are different from each other, the second bit value is expressed by a second amplitude value that is different from the first amplitude value, the same amplitude values are not continuously taken, and the data is coded and transmitted such that a polarity of the amplitude value is inverted in each period. However, in cases where the bidirectional communication is realized, even if the code is used, it is necessary to provide the PLL circuit in order to produce the clock used in transmitting the signal.

In light of the foregoing, it is desirable to provide a novel and improved information processing apparatus and bidirectional transmission method, wherein duplex transmission can be realized by a code, in which the direct-current component is not included and the PLL circuit is unnecessary in reproducing the clock, even if the PLL circuit is not provided on the reception side.

According to an embodiment of the present invention, there is provided an information processing apparatus which includes a first module and a second module. The first module includes a first data signal producing unit that produces a first data signal by coding a first transmitted data into a waveform, the waveform not including a direct-current component, a polarity of the waveform being inverted in each half period of a clock; a first signal sending unit that sends the first data signal to a second module; and a signal subtracting unit that subtracts the first data signal from a signal received from the second module. The second module includes a clock detecting unit that detects the clock based on the polarity inverting period of the first data signal received from the first module; a second data signal producing unit that produces a second data signal by coding a second transmitted data into a waveform using the clock detected by the clock detecting unit, the waveform not including the direct-current component; and a second signal sending unit that sends the second data signal to the first module while the second data signal is synchronously added to the first data signal sent from the first module.

Furthermore, the first data signal producing unit may include a data coding unit that codes the first transmitted data into a code to produce a coding signal, the code having a transmission rate of Fb, the code not including the direct-current component, a first bit value being expressed by a plurality of first amplitude values, a second bit value that is different from the first bit value being expressed by a second amplitude value that is different from the first amplitude value; and a synchronous adding unit that produce the first data signal by synchronously adding a clock to the first data signal, the clock having a transmission rate of Fb/2 and having amplitude larger than that of the coding signal.

Furthermore, the second data signal producing unit may produce the second data signal by coding the second transmitted data into an ASK (Amplitude Shift Keying) code having a transmission rate of Fb/2.

The first module may further include a signal superposition unit that produces a superimposed signal by superimposing a power signal supplied from a direct-current power supply on the first data signal. The first signal sending unit may send the superimposed signal to the second module. The second module may further include a signal separation unit that separates the superimposed signal received from the first module into the power signal and the first data signal.

The information processing apparatus may be a mobile instrument including a body portion and a display portion connected by a movable member. the first module may correspond to the body portion in which at least an arithmetic processing unit is incorporated. The second module may correspond to the display portion in which at least a display screen is incorporated.

Furthermore, the signal subtracting unit may subtract digital data of the first data signal from digital data of the signal received from the second module.

According to another embodiment of the present invention, there is provided a duplex transmission method, including the steps of producing a first data signal by coding a first transmitted data into a waveform using a first module, the waveform not including a direct-current component, a polarity of the waveform being inverted in each half period of a clock; sending the first data signal to a second module using the first module; detecting the clock using the second module based on the polarity inverting period of the first data signal received from the first module; producing a second data signal by coding a second transmitted data into a waveform with the clock detected by the clock detecting unit using the second module, the waveform not including the direct-current component; sending the second data signal to the first module using the second module while the second data signal is synchronously added to the first data signal sent from the first module; and extracting the second data signal by subtracting the first data signal from the signal received from the second module using the first module.

According to another embodiment of the invention, there is provided a program that causes a computer to realize a function possessed by the information processing apparatus. According to still another embodiment of the invention, there is provided a recording medium that can be read by a computer in which the program is recorded.

As described above, in the embodiments of the invention, the duplex transmission can be realized by the code, in which the direct-current component is not included and the PLL circuit is unnecessary in reproducing the clock, even if the PLL circuit is not provided on the reception side.

BRIEF DESCRIPTION OF THE DRAWINGS

FIG. 12 is an explanatory view illustrating a configuration example of a determination table for determining data;

FIG. 20 is an explanatory view illustrating a circuit configuration example of a decoder of the embodiment; and FIG. 21 is an explanatory view illustrating a relationship between a received signal waveform and a threshold for determining data.

DETAILED DESCRIPTION OF EMBODIMENT

Figure 1:
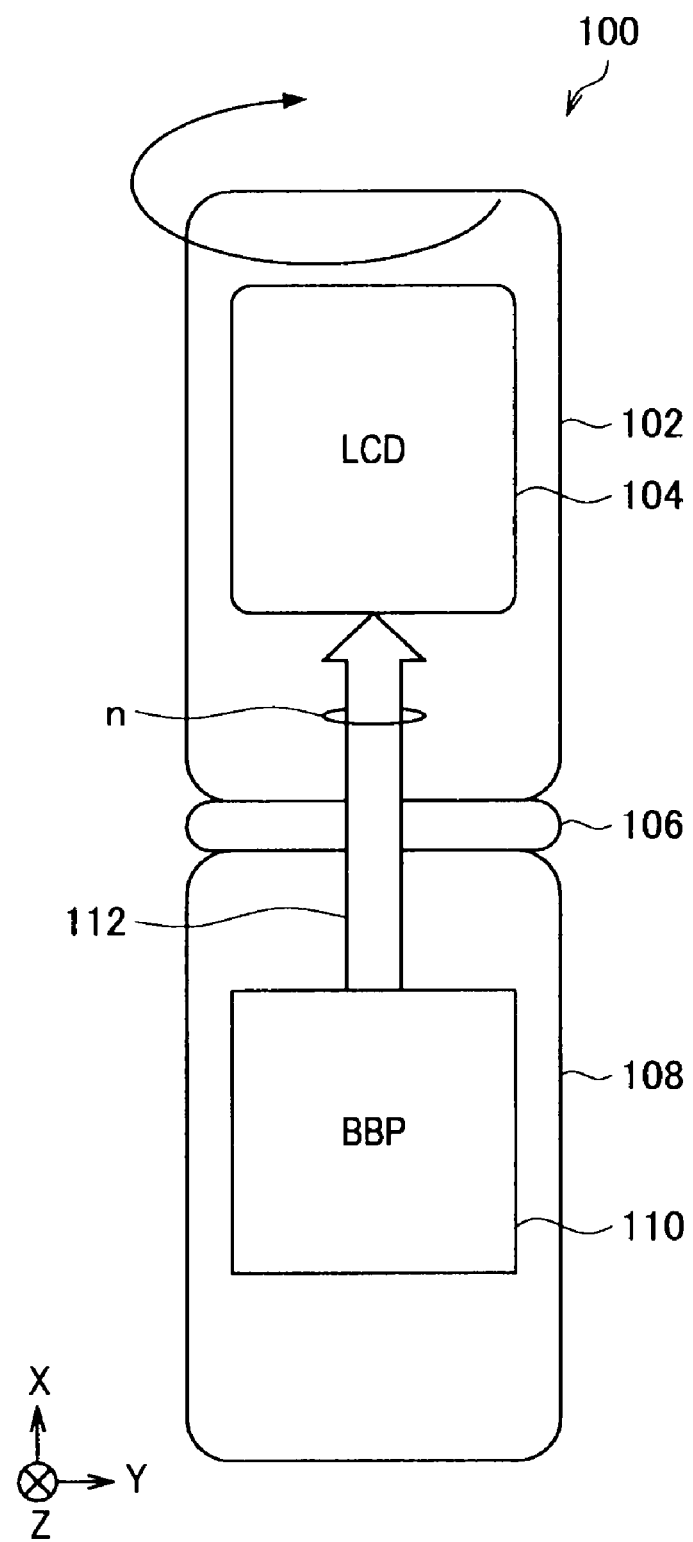
FIG. 1 is an explanatory view illustrating a configuration example of a mobile terminal.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

[Flow of Description]

A flow of description about an embodiment of the invention will briefly be made below. First a technical problem with a mobile terminal in which the parallel transmission system is adopted will briefly be described with reference to FIG. 1. Then a problem with the signal transmission technique in which the serial transmission system is adopted will be described with reference to FIGS. 2 to 6. Then a novel signal transmission technique devised to solve the problem with the signal transmission technique in which the serial transmission system is adopted will be described with reference to FIGS. 7 to 11. A technical problem with the novel signal transmission technique will also be described.

Based on technical feature and problem possessed by the novel signal transmission technique, a technique of extending the technique involved in the novel system to bidirectional transmission (extended system) will be described with reference to FIGS. 12 to 15. Then a functional configuration and a signal transmission method of a mobile terminal according to the embodiment of the invention that enables duplex transmission based on the extended system will be described with reference to FIGS. 16 to 21. Finally a technical thought of the embodiment is summarized, and the effect obtained from the technical thought will briefly be described.

(Description Article)
1. Organization of problem
1-1. Parallel transmission system
1-2. Serial transmission system
1-3. Data transmission system with power supply line
2. Fundamental technique 1 (novel system)
3. Fundamental Technique 2 (extension of novel system to bidirectional transmission; extended system)
4. Embodiment
4-1. Functional configuration of mobile terminal 500
4-2. Duplex transmission code
4-3. Summary

1. Organization of Problem

The problem to be solved technique by an embodiment of the invention will briefly be summarized prior to the detailed description of the technique of the embodiment.

1-1. Parallel Transmission System

A configuration example of a mobile terminal 100 in which the parallel transmission system is adopted will be described with reference to FIG. 1. FIG. 1 is an explanatory view illustrating a configuration example of the mobile terminal 100 in which the parallel transmission system is adopted. FIG. 1 schematically illustrates a mobile telephone that is of an example of the mobile terminal 100. However, an application range of the following technique is not limited to the mobile telephone.

Referring to FIG. 1, the mobile terminal 100 mainly includes a display unit 102, a liquid crystal unit 104 (LCD: Liquid Crystal Display), a connection unit 106, a manipulation unit 108, a baseband processor 110 (BBP), and a parallel signal line 112. Sometimes the display unit 102 is referred to as display side (D) while the manipulation unit 108 is referred to as body side (M). The case in which a video image signal is transmitted from the body side to the display side is described by way of example. Obviously the following technique is not limited to the case in which the video image signal is transmitted from the body side to the display side.

As illustrated in FIG. 1, the liquid crystal unit 104 is provided in the display unit 102. The video image signal transmitted through the parallel signal line 112 is displayed on the liquid crystal unit 104. The connection unit 106 is a connection member that connects the display unit 102 and the manipulation unit 108. The connection member constituting the connection unit 106 has a structure in which the display unit 102 can be rotated by 180 degrees in a Z-Y plane. The connection member also has a structure in which the mobile terminal 100 can be folded while the display unit 102 can be rotated in an X-Z plane. The connection member may have a structure in which the display unit 102 can be moved in a free direction.

The baseband processor 110 is an arithmetic processing unit that provides a function of controlling communication of the mobile terminal 100 and a function of executing an application. The parallel signal output from the baseband processor 110 is transmitted to the liquid crystal unit 104 of the display unit 102 through the parallel signal line 112. Many signal lines are provided in the parallel signal line 112. For example, in the case of the mobile telephone, the number n of signal lines is about 50. In cases where resolution of the liquid crystal unit 104 is QVGA, a transmission rate of the video image signal becomes about 130 Mbps. The parallel signal line 112 is provided so as to pass through the connection unit 106.

That is, many signal lines constituting the parallel signal line 112 are provided in the connection unit 106. When the movable range of the connection unit 106 is widen as described above, a risk of generating a breakage of the parallel signal line 112 is increased because of the movement of the connection unit 106, which causes reliability of the parallel signal line 112 to be degraded. On the other hand, when the reliability of the parallel signal line 112 is maintained, the movable range of the connection unit 106 is restricted. Therefore, frequently the serial transmission system is adopted in the mobile telephone in order to achieve a balance between a degree of freedom of the movable member constituting the connection unit 106 and the reliability of the parallel signal line 112. The serialization of the transmission line is advanced from the viewpoint of Electro Magnetic Interference (EMI).

1-2. Serial Transmission System

Figure 2:
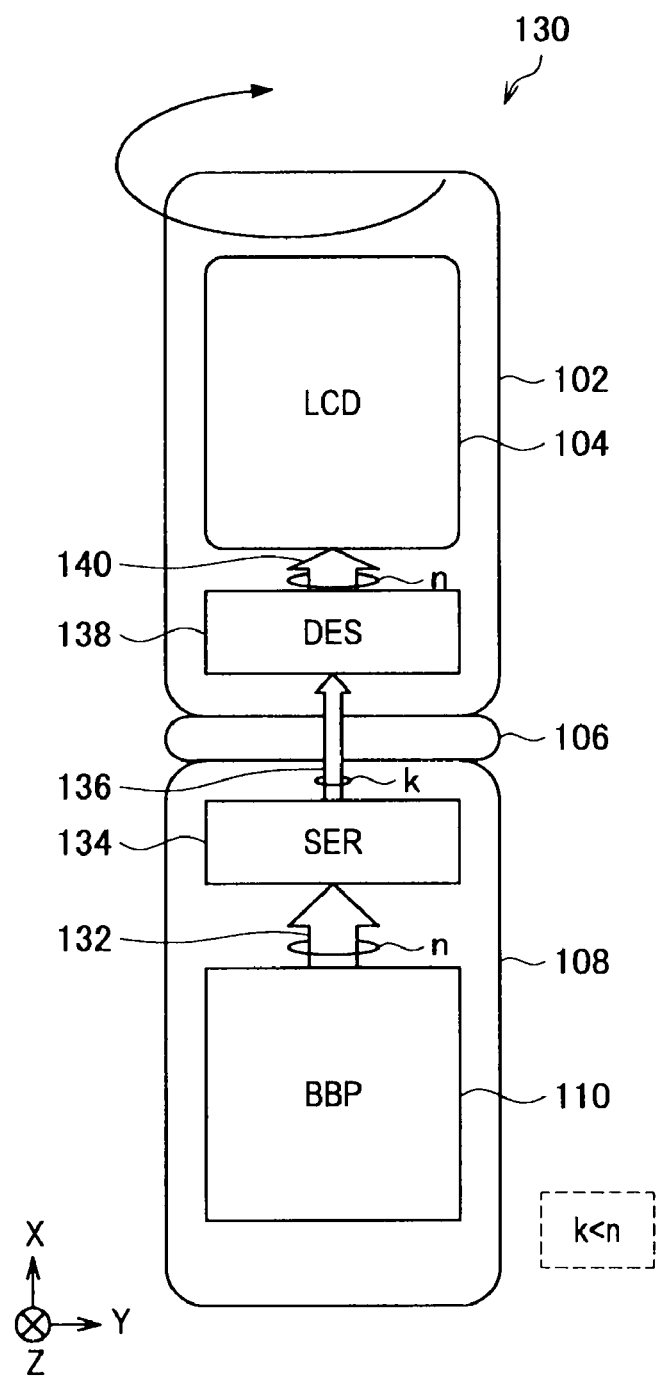
FIG. 2 is an explanatory view illustrating a configuration example of a mobile terminal.

A structure example of the mobile terminal 130 in which the serial transmission system is adopted will briefly be described with reference to FIG. 2. FIG. 2 is an explanatory view illustrating a configuration example of the mobile terminal 130 in which the serial transmission system is adopted. FIG. 2 schematically illustrates a mobile telephone as an example of the mobile terminal 130. However, an application range of the following technique is not limited to the mobile telephone. The component having the substantially same function as the mobile terminal 100 of the parallel transmission system of FIG. 1 is designated by the same numeral, and the detailed description is omitted.

Referring to FIG. 2, a mobile terminal 130 mainly includes the display unit 102, the liquid crystal unit 104 (LCD), the connection unit 106, the manipulation unit 108, the baseband processor 110 (BBP), parallel signal lines 132 and 140, a serializer 134, a serial signal line 136, and a deserializer 138.

The mobile terminal 130 differs from the mobile terminal 100 in that the video image signal is transmitted by the serial transmission system through the serial signal line 136 provided in the connection unit 106. Therefore, the serializer 134 is provided in the manipulation unit 108 in order to serialize the parallel signal output from the baseband processor 110. On the other hand, the deserializer 138 is provided in the display unit 102 in order to parallelize the serial signal transmitted through the serial signal line 136.

The serializer 134 converts the parallel signal, which is output from the baseband processor 110 and input through the parallel signal line 132, into the serial signal. The serial signal converted by the serializer 134 is input into the deserializer 138 through the serial signal line 136. The deserializer 138 restores the input serial signal to the original parallel signal to input the parallel signal into the liquid crystal unit 104 through the parallel signal line 140.

Only the data signal coded by the NRZ coding system is transmitted to the serial signal line 136, or the data signal and the clock signal are simultaneously transmitted to the serial signal line 136. The number k of serial signal lines 136 is much smaller than the number n of parallel signal lines 112 possessed by the mobile terminal 100 of FIG. 1 ($1 \leq k \ll n$). For example, the number k of lines can be decreased to several lines. Therefore, the degree of freedom concerning the movable range of the connection unit 106 in which the serial signal lines 136 are provided is much larger than that of the connection unit 106 in which the parallel signal lines 112 are provided. Reliability of the serial signal line 136 is also high.

A differential signal such as a Low Voltage Differential Signal (LVDS) is usually used as the serial signal passing through the serial signal line 136.

(Functional Configuration)

Figure 3:
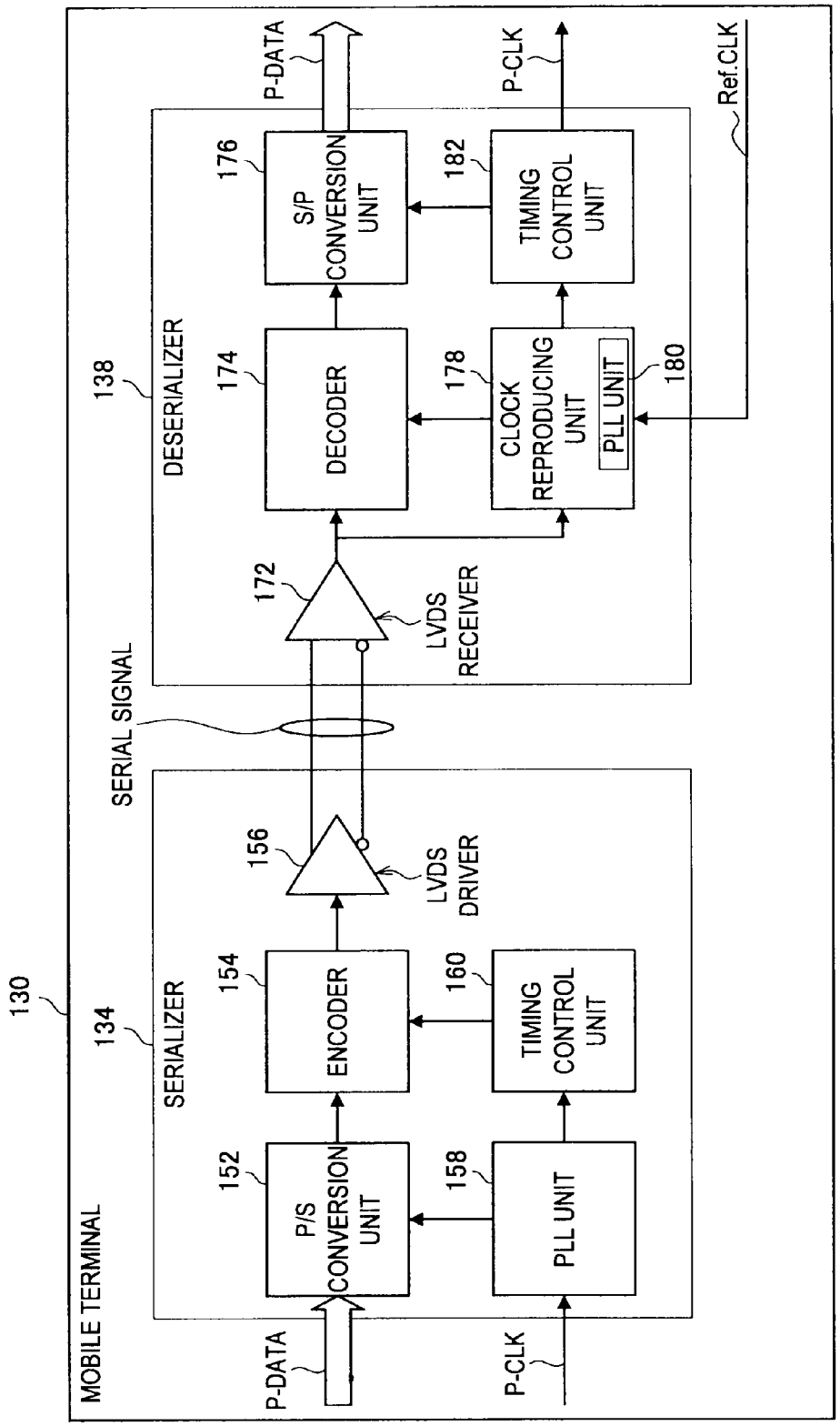
FIG. 3 is an explanatory view illustrating a functional configuration example of the mobile terminal involved in serial transmission.

A functional configuration of the mobile terminal 130 in which the serial transmission system is adopted will be described with reference to FIG. 3. FIG. 3 is an explanatory view illustrating an example of the functional configuration of the mobile terminal 130 in which the serial transmission system is adopted. However, FIG. 3 is the explanatory view mainly illustrating functional configurations of the serializer 134 and deserializer 138, and descriptions of other components are omitted.

(Serializer 134)

Referring to FIG. 3, the serializer 134 includes a P/S conversion unit 152, an encoder 154, an LVDS driver 156, a PLL unit 158, and a timing control unit 160.

As illustrated in FIG. 3, a parallel signal (P-DATA) and a clock for parallel signal (P-CLK) are input into the serializer 134 from the baseband processor 110. The parallel signal input into the serializer 134 is converted into the serial signal by the P/S conversion unit 152. The serial signal converted by the P/S conversion unit 152 is input into the encoder 154. The encoder 154 adds a header to the serial signal and inputs the serial signal to the LVDS driver 156. The LVDS driver 156 transmits the input serial signal to the deserializer 138 by the differential transmission system in which LVDS is used.

On the other hand, the clock for parallel signal input into the serializer 134 is input into the PLL unit 158. The PLL unit 158 produces a clock for serial signal from the clock for parallel signal and inputs the clock for serial signal to the P/S conversion unit 152 and the timing control unit 160. The timing control unit 160 controls serial-signal sending timing of the encoder 154 based on the input clock for serial signal.

(Deserializer 138)

Referring to FIG. 3, the deserializer 138 mainly includes an LVDS receiver 172, a decoder 174, an S/P conversion unit 176, a clock reproducing unit 178, a PLL unit 180, and a timing control unit 182.

As illustrated in FIG. 3, the deserializer 134 transmits the serial signal to the deserializer 138 by the differential transmission system in which LVDS is used. The LVDS receiver 172 receives the serial signal. The serial signal received by the LVDS receiver 172 is input into the decoder 174 and the clock reproducing unit 178. The decoder 174 refers to the header of the input serial signal to detect a leading portion of the data and inputs the serial signal to the S/P conversion unit 176. The S/P conversion unit 176 converts the input serial signal into the parallel signal (P-DATA). The parallel signal converted by the S/P conversion unit 176 is output into the liquid crystal unit 104.

On the other hand, the clock reproducing unit 178 reproduces the clock for parallel signal from the clock for serial signal using the built-in PLL unit 180 while referring to a reference clock input from the outside. The clock for parallel signal, which is reproduced by the clock reproducing unit 178, is input into the decoder 174 and the timing control unit 182. The timing control unit 182 controls reception timing based on the clock for parallel signal, which is input from the clock reproducing unit 178. The clock for parallel signal (P-CLK), which is input into the timing control unit 182, is output to the liquid crystal unit 104.

Thus, the parallel signal (P-DATA) and the clock for parallel signal, which are input from the baseband processor 110 into the serializer 134, are transmitted to the deserializer 138 while converted into the serial signals. The deserializer 138 restores the input serial signals to the original parallel signal and clock for parallel signal and outputs the parallel signal and the clock for parallel signal to the liquid crystal unit 104.

As described above, in the mobile terminal 130, the parallel signal (P-CLK) is converted into the serial signal, and the serial signal is transmitted, thereby serializing the transmission line. Therefore, the movable range of the portion in which the serial signal line is disposed is enlarged to improve the degree of freedom concerning the disposition of the display unit 102, so that the mobile terminal 130 can be deformed such that the display unit 102 is disposed landscape when viewed from the user, for example, in cases where the user views the television broadcasting with the mobile terminal 130. Thanks to the improvement of the degree of freedom, the use of the mobile terminal 130 is widened to generate various applications such as looking and listening of a video image or music in addition to various functions as the communication terminal.

1-3. Data Transmission System with Power Supply Line

The Manchester coding system (see FIG. 5) and AMI coding system (see FIG. 6), in which the direct-current component is not included, can be used as the coding system in the mobile terminal 130. The coding signal in which the direct-current component is not included can be transmitted while superimposed on the power supply. The technique of applying the power supply line transmission system to the mobile terminal 130 will be described below. A mobile terminal 230 is an example of a configuration in which the technique is adopted.

(Functional Configuration)

Figure 4:
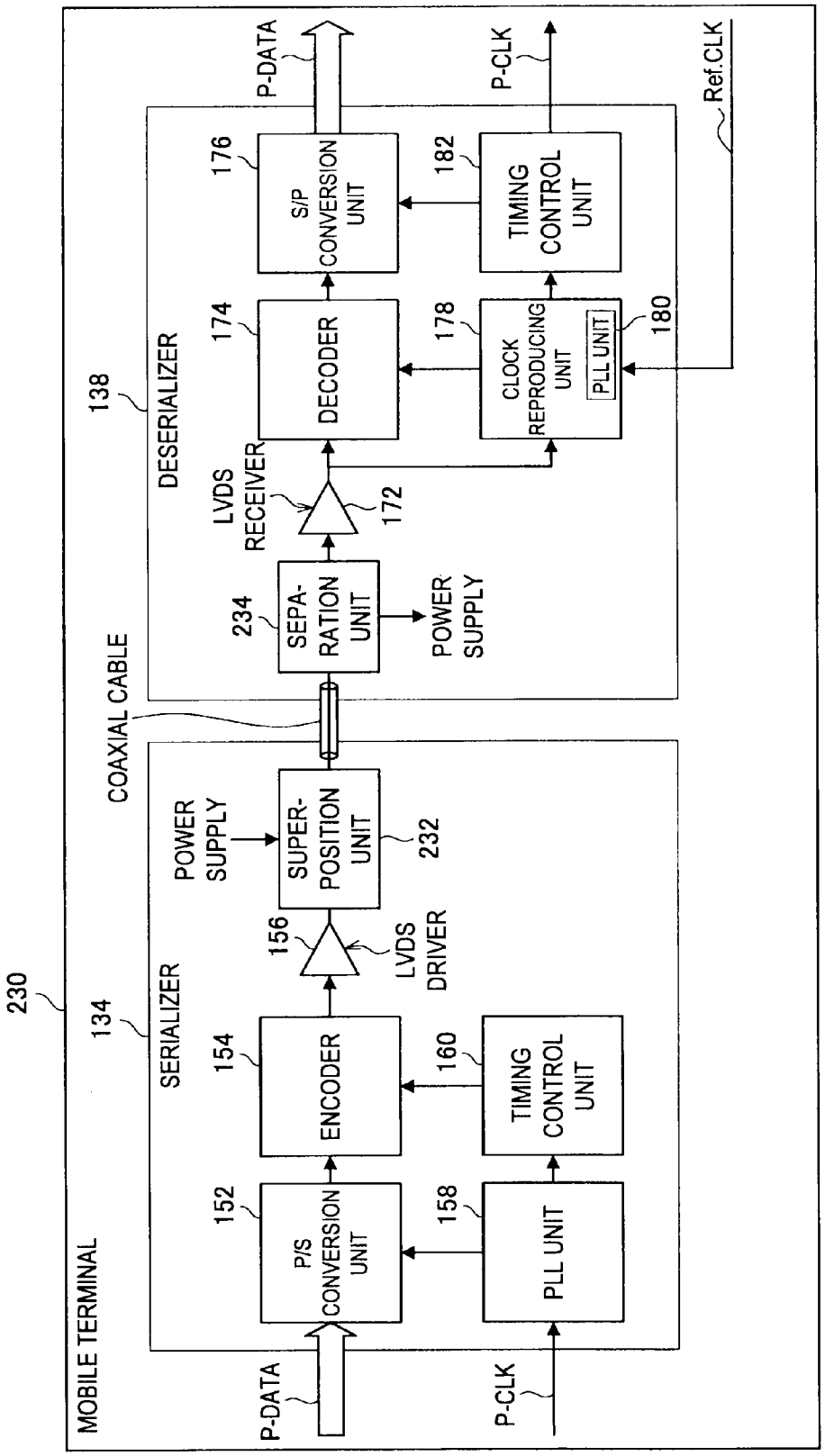
FIG. 4 is an explanatory view illustrating a functional configuration example of a mobile terminal involved in serial transmission.

First a functional configuration of the mobile terminal 230 that can transmit the data with the power supply line will be described with reference to FIG. 4. FIG. 4 is an explanatory view illustrating an example of the functional configuration of the mobile terminal 230 that can transmit the data through the power supply line. However, FIG. 4 is the explanatory view mainly illustrating functional configurations of the serializer 134 and deserializer 138, and descriptions of other components are omitted. In components included in the mobile terminal 230, the component having the substantially same functional configuration as the mobile terminal 130 is designated by the same numeral, and the detailed description is omitted.

(Serializer 134)

Referring to FIG. 4, the serializer 134 includes the P/S conversion unit 152, the encoder 154, the LVDS driver 156, the PLL unit 158, the timing control unit 160, and a superposition unit 232.

As illustrated in FIG. 4, the baseband processor 110 inputs the parallel signal (P-DATA) and the clock for parallel signal (P-CLK) to the serializer 134. The P/S conversion unit 152 converts the parallel signal, input into the serializer 134, into the serial signal. The serial signal converted by the P/S conversion unit 152 is input into the encoder 154. The encoder 154 adds the header to the serial signal to code the serial signal by a coding system such as the Manchester coding system in which the direct-current component does not exist or a coding system in which a small number of direct-current components exist and inputs the serial signal to the LVDS driver 156.

The LVDS driver 156 converts the input serial signal into LVDS to input the signal to the superposition unit 232. The superposition unit 232 transmits the signal to the deserializer 138 while superimposing the signal input from the LVDS driver 156 on the power supply line. For example, the superposition unit 232 couples the signal with a capacitor and couples the power supply with a choke coil. In the power supply line, for example, a coaxial cable is used as the transmission line. The power supply line is a line that is provided to supply the power from the manipulation unit 108 to the display unit 102.

The clock for parallel signal, which is input into the deserializer 134, is input into the PLL unit 158. The PLL unit 158 produces the clock for serial signal from the clock for parallel signal to input the clock for serial signal to the P/S conversion unit 152 and the timing control unit 160. The timing control unit 160 controls serial-signal transmission timing of the encoder 154 based on the input clock for serial signal.

(Deserializer 138)

Referring to FIG. 4, the deserializer 138 mainly includes the LVDS receiver 172, the decoder 174, the S/P conversion unit 176, the clock reproducing unit 178, the PLL unit 180, a timing control unit 182, and a separation unit 234.

Figure 5:
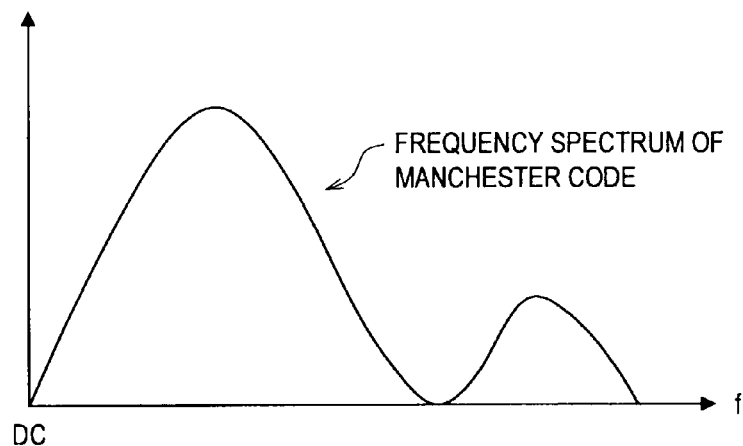
FIG. 5 is an explanatory view illustrating an example of a frequency spectrum of a Manchester code.

As illustrated in FIG. 4, the signal in which the power supply and the serial signal are superimposed on each other is transmitted to the deserializer 138 through the power supply line (coaxial cable). FIG. 5 illustrates a frequency spectrum of the superimposed signal. As illustrated in FIG. 5, it is found that the serial signal and the power supply (DC) can simultaneously be transmitted because the frequency spectrum of the Manchester code does not have the direct-current component.

Referring to FIG. 4, the separation unit 234 separates the superimposed signal into the serial signal and the power supply. For example, the separation unit 234 cuts out the direct-current component with a capacitor to extract the serial signal and cuts out a high-frequency component with a choke coil to extract the power supply. The LVDS receiver 172 receives the serial signal separated by the separation unit 234.

The serial signal received by the LVDS receiver 172 is input into the decoder 174 and the clock reproducing unit 178. The decoder 174 refers to the header of the input serial signal to detect the leading portion of the data and decodes the serial signal coded by the Manchester coding system to input the serial signal to the S/P conversion unit 176. The S/P conversion unit 176 converts the input serial signal into the parallel signal (P-DATA). The parallel signal converted by the S/P conversion unit 176 is output to the liquid crystal unit 104.

On the other hand, the clock reproducing unit 178 reproduces the clock for parallel signal from the clock for serial signal with the built-in PLL unit 180 while referring to the reference clock input from the outside. The clock for parallel signal, which is reproduced by the clock reproducing unit 178, is input into the decoder 174 and the timing control unit 182. The timing control unit 182 controls reception timing based on the clock for parallel signal, which is input from the clock reproducing unit 178. The clock for parallel signal (P-CLK), which is input into the timing control unit 182, is supplied to the liquid crystal unit 104.

Thus, in the mobile terminal 230, because the power supply and the serial signal (such as video image signal) can be transmitted through one coaxial cable, only one line connects the manipulation unit 108 and the display unit 102. Therefore, the movability of the display unit 102 is improved to deform the mobile terminal 230 into the complicated shape, so that user-friendliness is improved while the application of the mobile terminal 230 is widened.

(Organization of Problem 1)

As described above, the parallel transmission system is not suitable to the mobile terminal 100 when the relative positional relationship between the manipulation unit 108 and the display unit 102 is freely changed. Therefore, in the mobile terminal 130, the serial transmission of the video image signal can be performed by providing the serializer 134 and the deserializer 138, and therefore the movable range of the display unit 102 is widened. Further, the system in which the signal is transmitted while superimposed on the power supply line is used by taking advantage of the characteristic of the coding system adopted in the mobile terminal 130, thereby improving the movability of the display unit 102.

As illustrated in FIGS. 3 and 4, in the mobile terminals 130 and 230, the PLL unit 180 (hereinafter abbreviated to PLL) is used to reproduce the clock of the received serial signal. It is necessary that PLL extract the clock from the signal coded by the Manchester coding. However, because the power consumption of PLL is not small, the power consumption of the mobile terminals 130 and 230 is increased when PLL is provided. The increase of the power consumption becomes troublesome in small devices such as the mobile telephone.

Therefore, there is a demand for the technique in which PLL is not provided on the side of the deserializer 138. From this technical viewpoint, there is devised a novel signal transmission system in which the signal is transmitted using a code. The code does not include the direct-current component, and the PLL circuit is unnecessary in reproducing the clock. Hereinafter sometimes the signal transmission system is simply referred to as novel system.

2. Fundamental Technique 1 (Novel System)

The novel signal transmission system (novel system) in which the signal is transmitted by the code a code, in which the direct-current component is not included and the clock can be reproduced without utilizing PLL, will be described below. First the AMI (Alternate Mark Inversion) code that becomes fundamental in describing the method of coding the novel system will briefly be described. Then a functional configuration of a mobile terminal 300 involved in the novel system and a coding method will be described.

(Signal Waveform of AMI Code)

Figure 6:
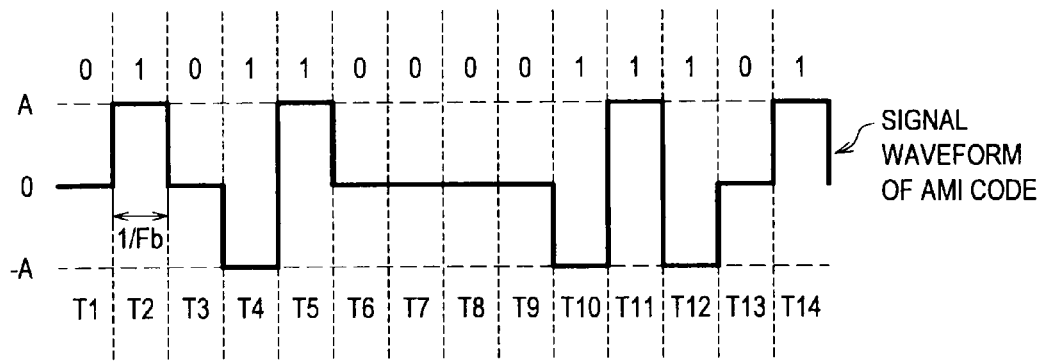
FIG. 6 is an explanatory view illustrating an example of a signal waveform of an AMI code.

A signal waveform and features of the AMI code will briefly be described with reference to FIG. 6. FIG. 6 is an explanatory view illustrating an example of the signal waveform of the AMI code. In the following description, it is assumed that the letter A is any positive number.

In the AMI code, data 0 is expressed by a potential 0, and data 1 is expressed by a potential A or −A. However, the potential A and the potential −A are alternately repeated. That is, when the data 1 appears after the data 1 is expressed by the potential A, the data 1 is expressed by the potential −A. Because the data is expressed by repeating polarity inversion, the AMI code does not include the direct-current component. For example, partial response system expressed by PR(1,−1), PR(1,0,−1), PR(1,0, . . . ,−1), and the like can be cited as the code having the characteristic similar to that of the AMI code. The transmission code in which the polarity inversion is used is referred to as bipolar code. A dicode system can also be adopted. The AMI code having a duty of 100% is described here by way of example.

FIG. 6 schematically illustrates the AMI code having bit intervals T1, T2, . . . , and T14. In FIG. 6, the data 1 appears at bit intervals T2, T4, T5, T10, T11, T12, and T14. In the case of the potential A at the bit interval T2, the bit interval T4 becomes the potential −A, and the bit interval T5 becomes the potential A. Thus, in the amplitude corresponding to the data 1, positive and negative amplitudes are alternately inverted. This is the polarity inversion.

On the other hand, all the pieces of data 0 are expressed by the potential 0. Although the AMI code does not include the direct-current component by the expression, sometimes the potentials 0 appear continuously as illustrated by the bit intervals T6, . . . , and T9 of FIG. 6. When the potentials 0 appear continuously, it is difficult to extract the clock component from the signal waveform without the use of PLL. Therefore, a technique in which the transmission is performed while the clock component is included in the AMI code (and a code having the characteristic equivalent to that of the AMI code) is used in the novel system.

(Functional Configuration)

Figure 7:
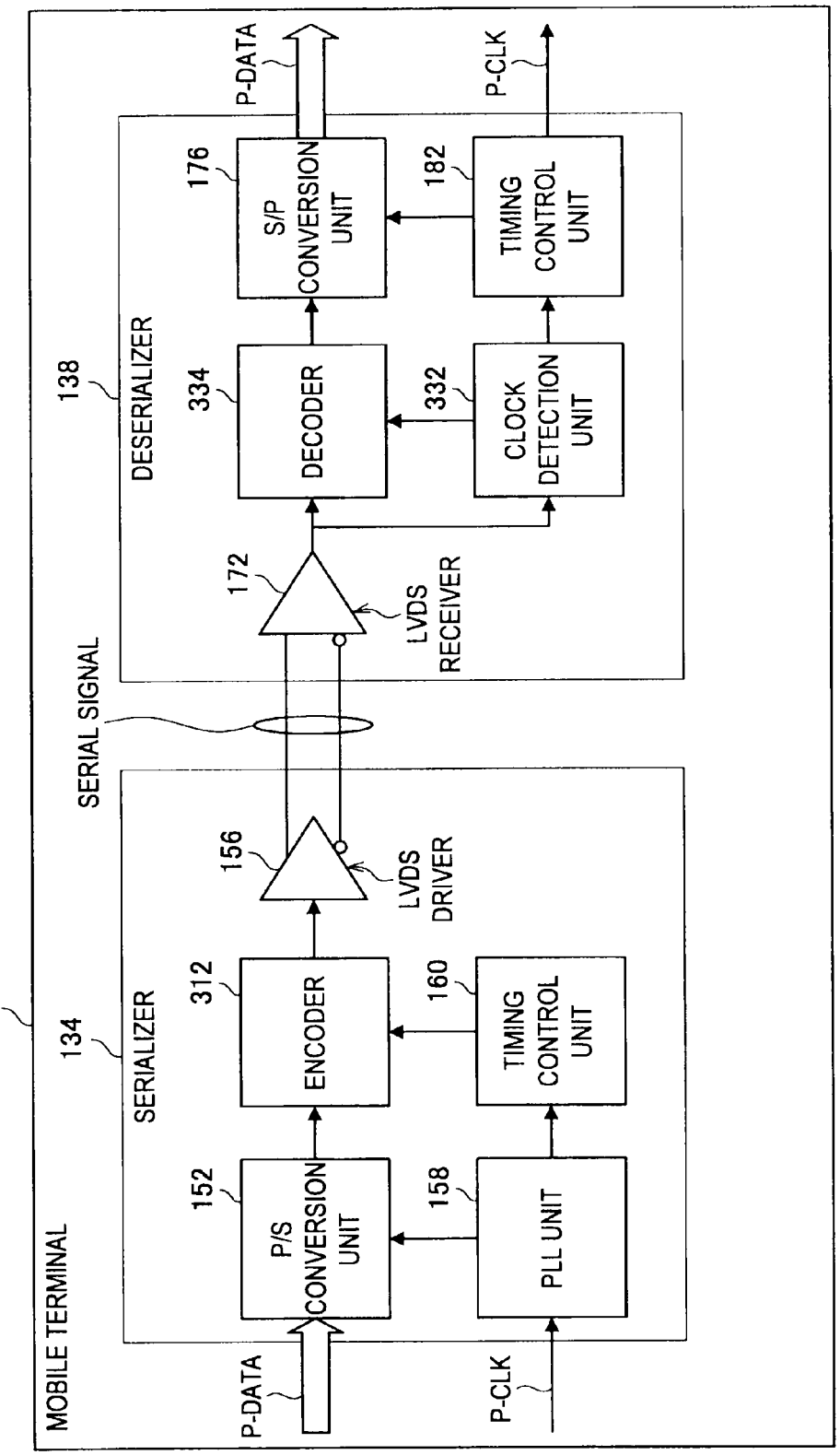
FIG. 7 is an explanatory view illustrating a functional configuration example of a mobile terminal involved in a novel system.

The functional configuration of the mobile terminal 300 involved in the novel system will be described with reference to FIG. 7. FIG. 7 is an explanatory view illustrating a functional configuration example of the mobile terminal 300 involved in the novel system. However, FIG. 7 is the explanatory view mainly illustrating the functional configurations of the serializer 134 and deserializer 138, and descriptions of other components are omitted. In components included in the mobile terminal 300, the component having the substantially same functional configuration as the mobile terminal 130 is designated by the same numeral, and the detailed description is omitted.

(Serializer 134)

Referring to FIG. 7, the serializer 134 includes the P/S conversion unit 152, the LVDS driver 156, the PLL unit 158, the timing control unit 160, and an encoder 312. The mobile terminal 300 differs mainly from the mobile terminal 130 in the function of the encoder 312.

As illustrated in FIG. 7, the baseband processor 110 inputs the parallel signal (P-DATA) and the clock for parallel signal (P-CLK) into serializer 134. The P/S conversion unit 152 converts the parallel signal, which is input into the serializer 134, into the serial signal. The serial signal converted by the P/S conversion unit 152 is input into the encoder 312. The encoder 312 adds the header to the serial signal and codes the serial signal by a predetermined coding system.

Figure 8:
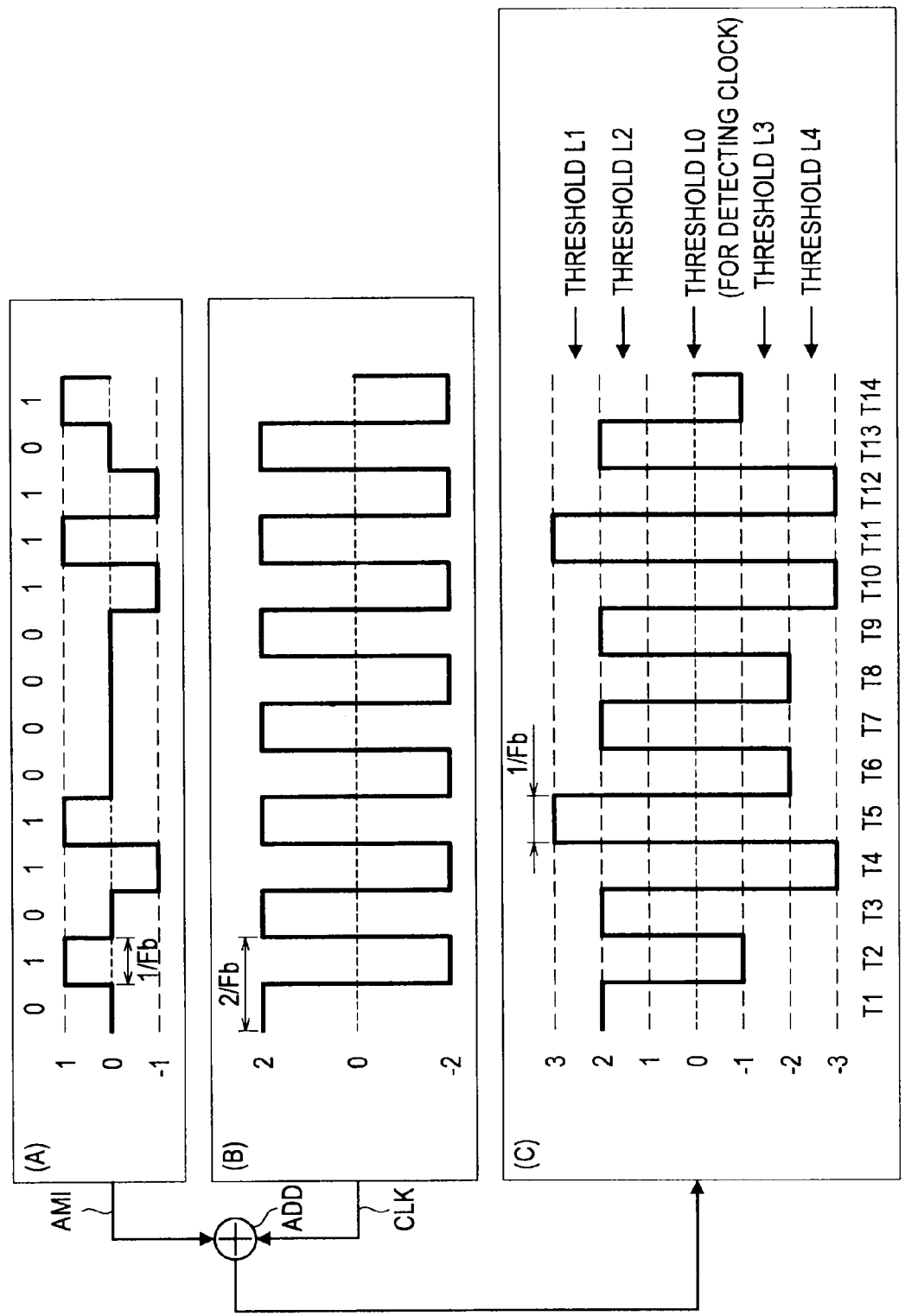
FIG. 8 is an explanatory view illustrating a signal producing method involved in the novel system.
Figure 9:
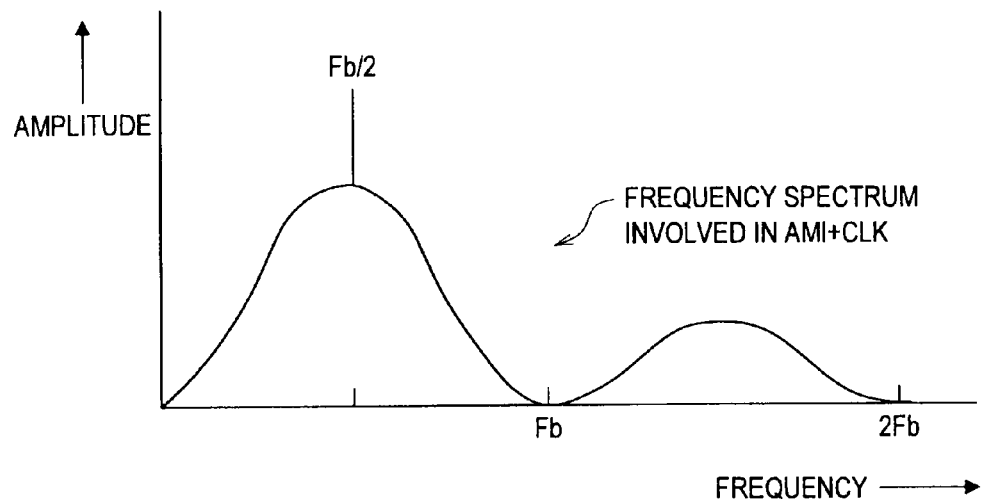
FIG. 9 is an explanatory view illustrating an example of a frequency spectrum of a signal involved in the novel system.

The method of producing the coding signal with the encoder 312 will be described with reference to FIG. 8. FIG. 8 is an explanatory view illustrating an example of a coding system involved in the novel system. FIG. 8 illustrates the code producing method based on the AMI code. The novel system is not limited to the code producing method of FIG. 8, but the novel system is similarly applied to the code having the characteristic equivalent to that of the AMI code. For example, the novel system can be applied to coding systems such as the bipolar code or the partial response system.

The signal of FIG. 8C is the signal that is coded by the coding method of the novel system. In the signal of FIG. 8C, the data 1 is expressed by a plurality of potentials A1 (−1,−3,1,3), and the data 0 is expressed by a plurality of potentials A2(−2,2) that are different from the potentials A1. However, the signal is formed such that the polarity is inverted, and the signal is formed such that the same potentials do not appear continuously. For example, when the pieces of data 0 appear continuously at the bit intervals T6, . . . , and T9 are referred to, the potentials becomes −2, 2, −2, and 2. Even if the pieces of data having the same value appear continuously, the rising and trailing edges can be detected to reproduce the clock component by utilizing the code of FIG. 8.

The encoder 312 includes an adder ADD to produce the code. As illustrated in FIG. 8, the encoder 312 codes the input serial signal into an AMI code (A) to input the AMI code (A) to the adder ADD. The encoder 312 also produces a clock (B) to input the clock (B) to the adder ADD. The clock (B) has half a frequency (2/Fb) of the transmission rate of Fb of the AMI code. It is assumed that the clock has the amplitude N (N>1, N=2 in FIG. 8) times the AMI code. The encoder 312 produces a code (C) by adding the AMI code and the clock with the adder ADD. At this point, the AMI code and the clock are synchronously added while the edges of the AMI code and clock are matched with each other.

Referring to FIG. 7, the serial signal coded by the encoder 312 is input into the LVDS driver 156. The LVDS driver 156 transmits the input serial signal to the deserializer 138 by the differential transmission system in which LVDS is used. On the other hand, the clock for parallel signal, which is input into the serializer 134, is input into the PLL unit 158. The PLL unit 158 produces the clock for serial signal from the clock for parallel signal and inputs the clock for serial signal to the P/S conversion unit 152 and the timing control unit 160. The timing control unit 160 controls the serial-signal transmission timing of the encoder 312 based on the input clock for serial signal.

(Deserializer 138)

Referring to FIG. 7, the deserializer 138 mainly includes the LVDS receiver 172, the S/P conversion unit 176, the timing control unit 182, a clock detecting unit 332, and a decoder 334. The deserializer 138 of the mobile terminal 300 differs mainly from the deserializer 138 of the mobile terminal 130 in that the clock detecting unit 332 that does not include PLL is provided.

As illustrated in FIG. 7, the serial signal is transmitted from the deserializer 134 to the deserializer 138 by the differential transmission system in which LVDS is used. The LVDS receiver 172 receives the serial signal. The serial signal received by the LVDS receiver 172 is input into the decoder 334 and the clock detecting unit 332. The decoder 334 refers to the header of the input serial signal to detect the leading portion of the data and decodes the serial signal coded by the coding system used in the encoder 312.

The decoding method performed by the decoder 334 will be described with reference to FIG. 8. As described above, the serial signal is coded in the form of FIG. 8C by the encoder 312. Therefore, the decoder 334 can decode the serial signal into the original serial signal by determining whether the amplitude of the signal is A1 or A2.

Four thresholds (L1, L2, L3, and L4) of FIG. 8C are used to distinguish between the amplitude A1(−1,−3,1,3) corresponding to the data 1 and the amplitude A2(−2,2) corresponding to the data 0. Therefore, the decoder 334 compares the amplitude of the input signal and the four thresholds to determine whether the amplitude is the amplitude A1 or the amplitude A2 and decodes the serial signal serial into the original serial signal. The decoding processing is described later (see FIGS. 10 to 13).

Referring to FIG. 7, the serial signal decoded by the decoder 334 is input into the S/P conversion unit 176. The S/P conversion unit 176 converts the input serial signal into the parallel signal (P-DATA). The parallel signal converted by the S/P conversion unit 176 is output to the liquid crystal unit 104.

On the other hand, the clock detecting unit 332 detects the clock component from the input signal. As described above, the amplitude and the threshold L0 (potential 0) are compared to determine the polarity of the amplitude by utilizing the code of FIG. 8C, which allows the clock component to be detected based on the period of the polarity inversion. Accordingly, in the clock detecting unit 332, PLL is not used in detecting the clock component of the signal. As a result, the power consumption of the deserializer 138 can be reduced.

The clock detected by the clock detecting unit 332 is input into the decoder 334 and the timing control unit 182. The timing control unit 182 controls the reception timing based on the clock input from the clock detecting unit 332. The clock (P-CLK) input into the timing control unit 182 is output to the liquid crystal unit 104.

Thus, the deserializer 138 detects the clock without the use of PLL by utilizing the code, in which the direct-current component is not included (see FIG. 9) and the clock component can be reproduced from the period of the polarity inversion, so that the power consumption of the mobile terminal can largely be reduced. For example, the frequency spectrum of the code used in the novel system has a shape of FIG. 9. A line spectrum appears at the frequency of Fb/2 of the clock added by the adder ADD of the encoder 312. Additionally the broad frequency spectrum of the AMI code also appears. In the frequency spectrum, null points exist at frequencies Fb, 2Fb, 3Fb, . . . .

(Detailed Decoding Processing)

Figure 10:
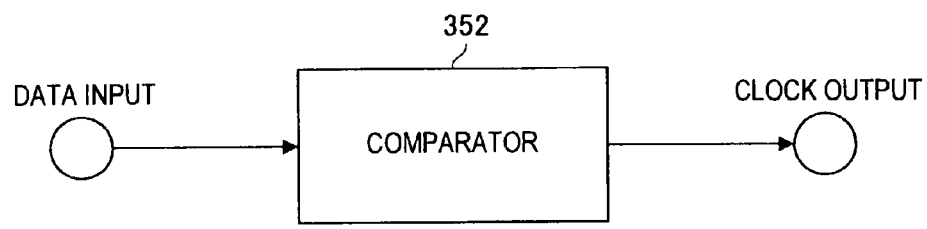
FIG. 10 is an explanatory view illustrating a circuit configuration example of a clock detecting unit.
Figure 11:
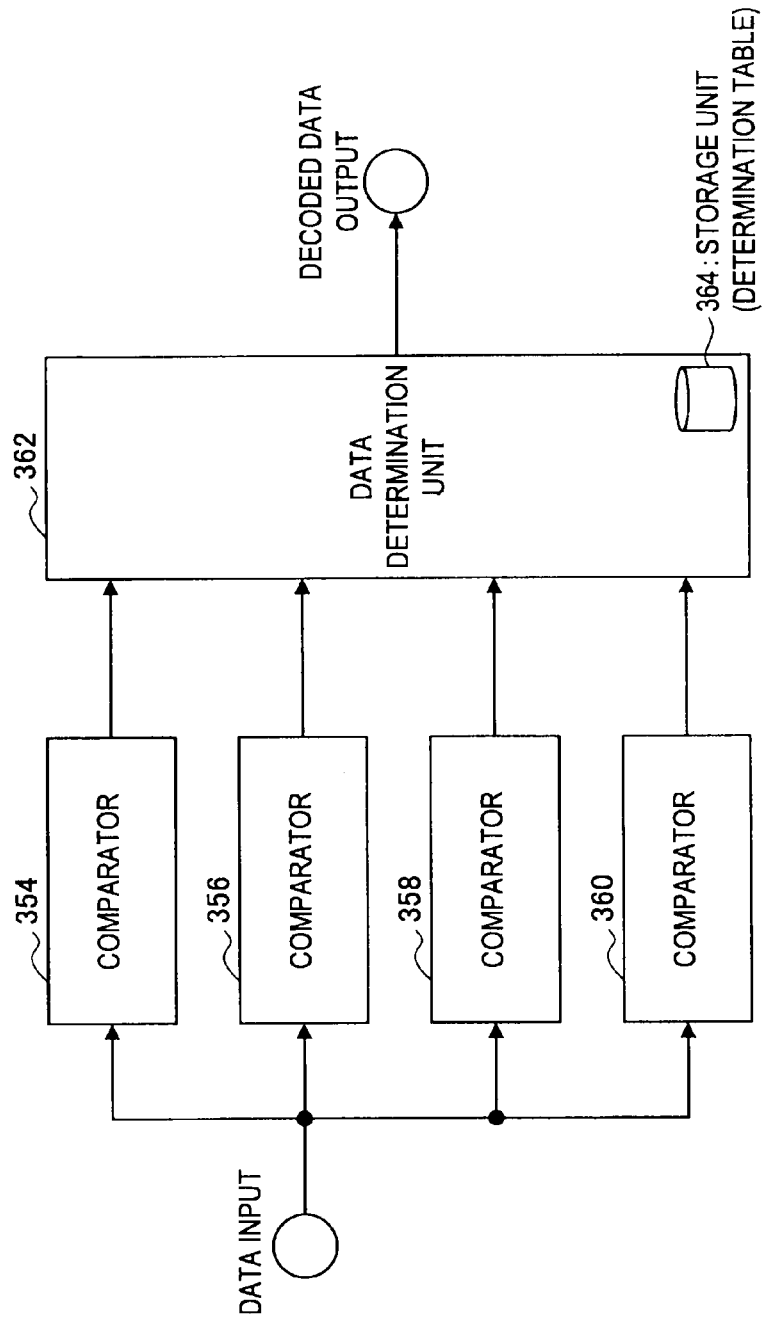
FIG. 11 is an explanatory view illustrating a circuit configuration example of a decoder.
Figure 13:
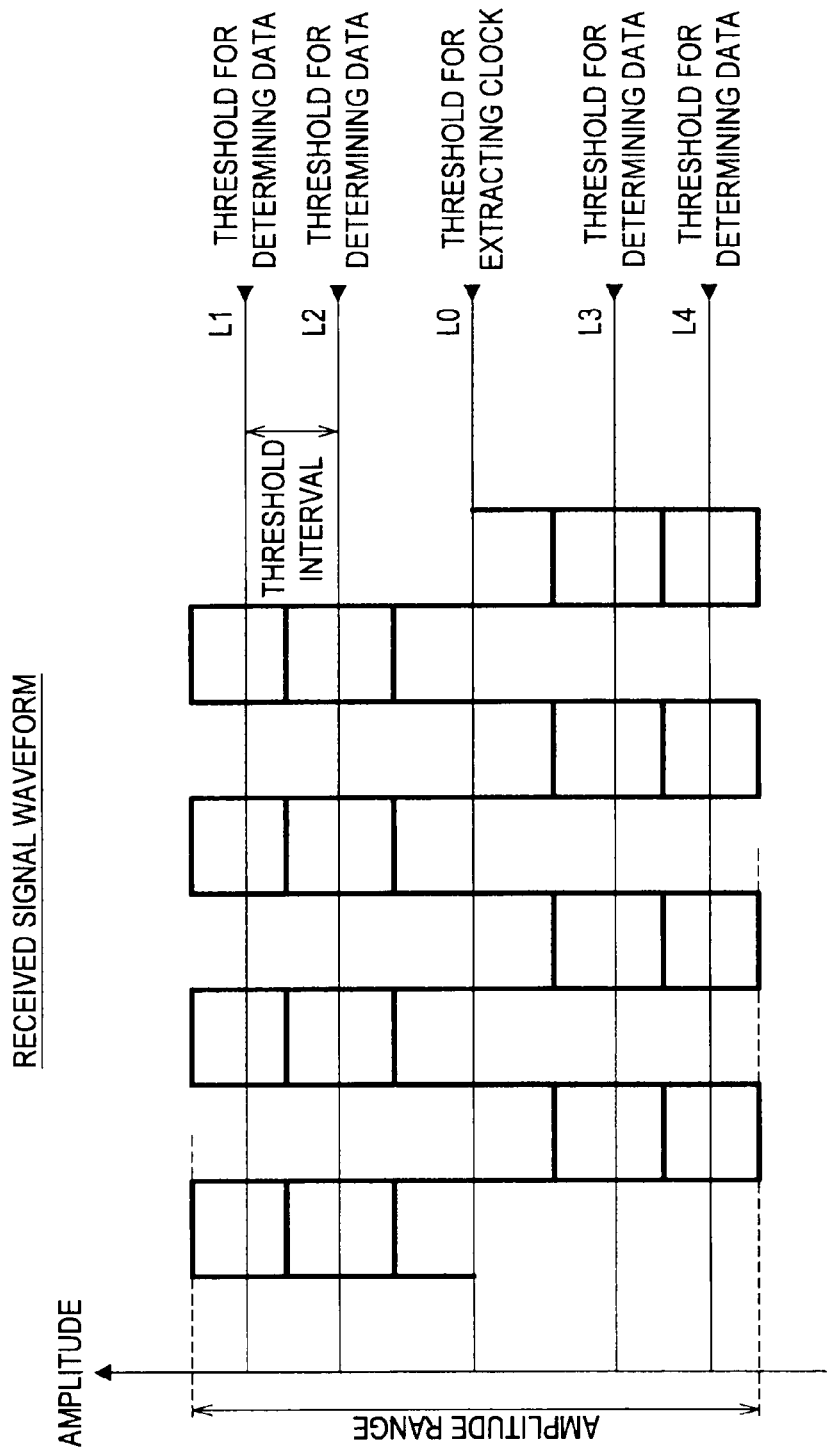
FIG. 13 is an explanatory view illustrating a relationship between a received signal waveform and a threshold for determining data.

Detailed decoding processing in the novel system will be described with reference to FIGS. 10 to 13. FIG. 10 is an explanatory view illustrating a circuit configuration example of the clock detecting unit 332. FIG. 11 is an explanatory view illustrating a circuit configuration example of the decoder 334. FIG. 12 is an explanatory view illustrating a configuration example of a determination table for determining data. FIG. 13 is an explanatory view illustrating a received signal waveform (an eye pattern is illustrated in FIG. 13) when the novel system is applied.

(Circuit Configuration Example of Clock Detecting Unit 332)

Referring to FIG. 10, the function of the clock detecting unit 332 is realized by a comparator 352.

The amplitude value of the signal coded by the novel system is input as input data into the comparator 352. When the input data is input, the comparator 352 compares the input amplitude value and a predetermined threshold. For example, the comparator 352 determines whether the input data is larger than the predetermined threshold. The comparator 352 extracts the clock from the code (see FIG. 8C) of the novel system. Therefore, the threshold L0 is used as the predetermined threshold.

For example, when the input data is larger than the predetermined threshold, the comparator 352 outputs a determination value (for example, 1) indicating that the input data is larger than the predetermined threshold. On the other hand, when the input data is smaller than the predetermined threshold, the comparator 352 outputs a determination value (for example, 0) indicating that the input data is smaller than the predetermined threshold. The output result of the comparator 352 is input as the clock into the decoder 334 and the timing control unit 182.

(Circuit Configuration Example of Decoder 334)

Referring to FIG. 11, the function of the decoder 334 is realized by a plurality of comparators 354, 356, 358, and 360 and a data determination unit 362. A storage unit 364 is provided in the data determination unit 362. The determination table for determining data is stored in the storage unit 364.

Thresholds that are different from one another are set to the plurality of comparators 354, 356, 358, and 360. For example, the threshold L1 is set to the comparator 354, the threshold L2 is set to the comparator 356, the threshold L3 is set to the comparator 358, and the threshold L4 is set to the comparator 360. However, as illustrated in FIG. 8C, a relationship of L1>L2>L3>L4 holds among the thresholds L1, L2, L3, and L4.

The amplitude value of the signal coded by the novel system is input as input data into the plurality of comparators 354, 356, 358, and 360. At this point, the same input data is input in parallel to the plurality of comparators 354, 356, 358, and 360.

When the input data is input, the comparator 354 compares the input data and the threshold L1 to determine whether the input data is larger than the threshold L1. When the input data is larger than the threshold L1, the comparator 354 outputs a determination value (for example, 1) indicating that the input data is larger than the threshold L1. On the other hand, when the input data is equal to or smaller than the threshold L1, the comparator 354 outputs a determination value (for example, 0) indicating that the input data is equal to or smaller than the threshold L1.

Similarly the comparator 356 compares the input data and the threshold L2 to determine whether the input data is larger than the threshold L2. The comparator 358 compares the input data and the threshold L3 to determine whether the input data is larger than the threshold L3. The comparator 360 compares the input data and the threshold L4 to determine whether the input data is larger than the threshold L4. The determination values output from the plurality of comparators 354, 356, 358, and 360 are input into the data determination unit 362.

The data determination unit 362 determines a bit value indicated by the input data based on the determination values output from the plurality of comparators 354, 356, 358, and 360. At this point, the data determination unit 362 refers to the determination table for determining data (see FIG. 12), which is stored in the storage unit 364 and determines the bit value indicated by the input data based on the determination table. FIG. 12 illustrates the determination table for determining data by way of example. As illustrated in FIG. 12, in the determination table, the bit value (0 or 1) is correlated with each combination of the values output from the plurality of comparators 354, 356, 358, and 360.

For example, it is assumed that the comparator 354 outputs the value of 1. At this point, the input data is larger than the threshold L1. As described above, the relationship of L1>L2>L3>L4 is defined in the thresholds. Therefore, the comparators 356, 358, and 360 output the values of 1. Referring to FIG. 8C, the bit value of 1 corresponds to the amplitude having the value larger than the threshold L1. Therefore, in the determination table, a combination of all the output values of 1 of the comparators 354, 356, 358, and 360 and the bit value 1 are described while correlated with each other.

Other conditions are also considered. For the sake of convenience, the output values of the comparators 354, 356, 358, and 360 are expressed by d1, d2, d3, and d4, and a combination of the output values is expressed by (d1,d2,d3,d4). For example, the combination of (d1,d2,d3,d4)=(0,1,1,1) means that the input data d has a relationship of L1>d>L2. Referring to FIG. 8C, in cases where the input data d has the relationship of L1>d>L2, the bit value becomes 0.

Similarly the combination of (d1,d2,d3,d4)=(0,0,1,1) means that the input data d has a relationship of L2>d>L3. Referring to FIG. 8C, in cases where the input data d has the relationship of L2>d>L3, the bit value becomes 1. The combination of (d1,d2,d3,d4)=(0,0,0,1) means that the input data d has a relationship of L3>d>L4. Referring to FIG. 8C, in cases where the input data d has the relationship of L3>d>L4, the bit value becomes 0. The combination of (d1,d2,d3,d4)=(0,0,0,0) means that the input data d has a relationship of L4>d. Referring to FIG. 8C, in cases where the input data d has the relationship of L4>d, the bit value becomes 1.

Thus, the combination of the output values output from the comparators 354, 356, 358, and 360 and the bit value can be correlated with each other, and FIG. 12 illustrates the determination table in which the correlation of the combination and the bit value is summarized. The data determination unit 362 refers to the determination table and determines the bit value based on the combination of the output values output from the plurality of comparators 354, 356, 358, and 360. The bit value determined by the data determination unit 362 is input into the S/P conversion unit 176.

(Organization of Problem 2)

As described above, the code of the novel system has the advantage that the code does not include the direct-current component and the clock can be reproduced without the use of the PLL circuit. Therefore, the signal can be transmitted while superimposed on the direct-current power supply like the mobile terminal 230, and it is not necessary to provide PLL on the reception side like the mobile terminal 300. The technique of the novel system described by taking the configuration of the mobile terminal 300 as an example relates to one-way signal transmission.

However, various devices are provided in addition to the liquid crystal unit 104 in the display unit 102 constituting the recent mobile terminal. For example, a touch panel is provided in the liquid crystal unit 104 or a camera or a manipulating switch is provided in the liquid crystal unit 104. Therefore, in the mobile instrument, not only the image data is transmitted to the liquid crystal unit 104, but also various kinds of data are transmitted from the display unit 102 to the manipulation unit 108. That is, in the mobile terminal, it is necessary that the data can bi-directionally be transmitted between the display unit 102 and the manipulation unit 108.

However, when the PLL circuit of the manipulation unit 108 is omitted using the code of the novel system, the clock used in the data transmission is hardly generated on the side of the display unit 102 in transmitting the data from the manipulation unit 108 to the display unit 102. On the other hand, when the PLL circuit is provided in the manipulation unit 108, the problems such as the increased power consumption and the enlarged circuit scale are generated as described in (organization of problem 1). Therefore, there is devised the technique of being able to transmit the data from the manipulation unit 108 to the display unit 102 without providing the PLL circuit in the manipulation unit 108 based on the use of the code of the novel system.

3. Fundamental Technique 2 (Extension of Novel System to Bidirectional Transmission; Extended System)

A technique of extending the data transmission method involved in the novel system to the bidirectional transmission will be described below. In following explanation, the data transmission system according to the technique is referred to an extended system. The extended system relates to the bidirectional transmission technique, in which the clock is extracted from the signal transmitted from the manipulation unit 108 to the display unit 102 without the use of the PLL circuit and the signal is transmitted from the display unit 102 to the manipulation unit 108 using the clock.

(Configuration Example of Mobile Terminal 400)

Figure 14:
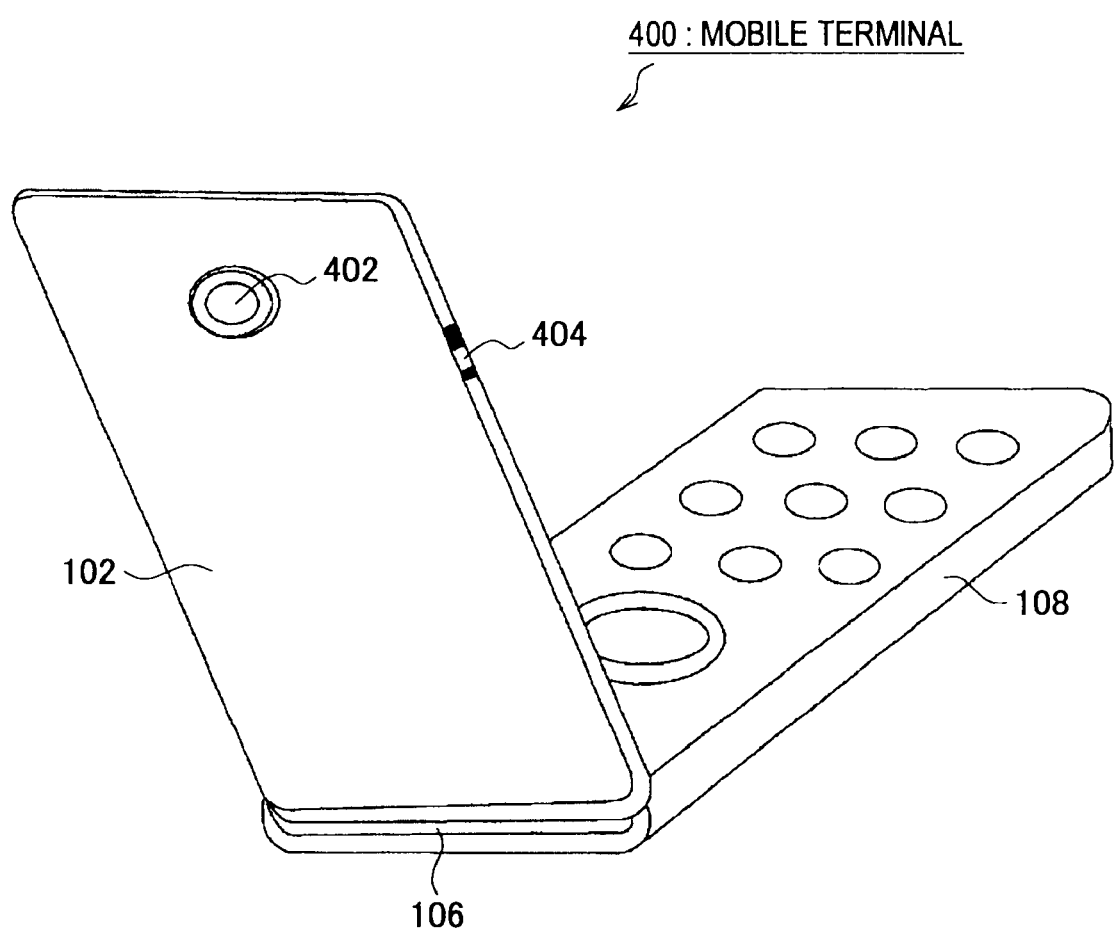
FIG. 14 is an explanatory view illustrating a configuration example of a mobile terminal involved in an extended system.
Figure 15:
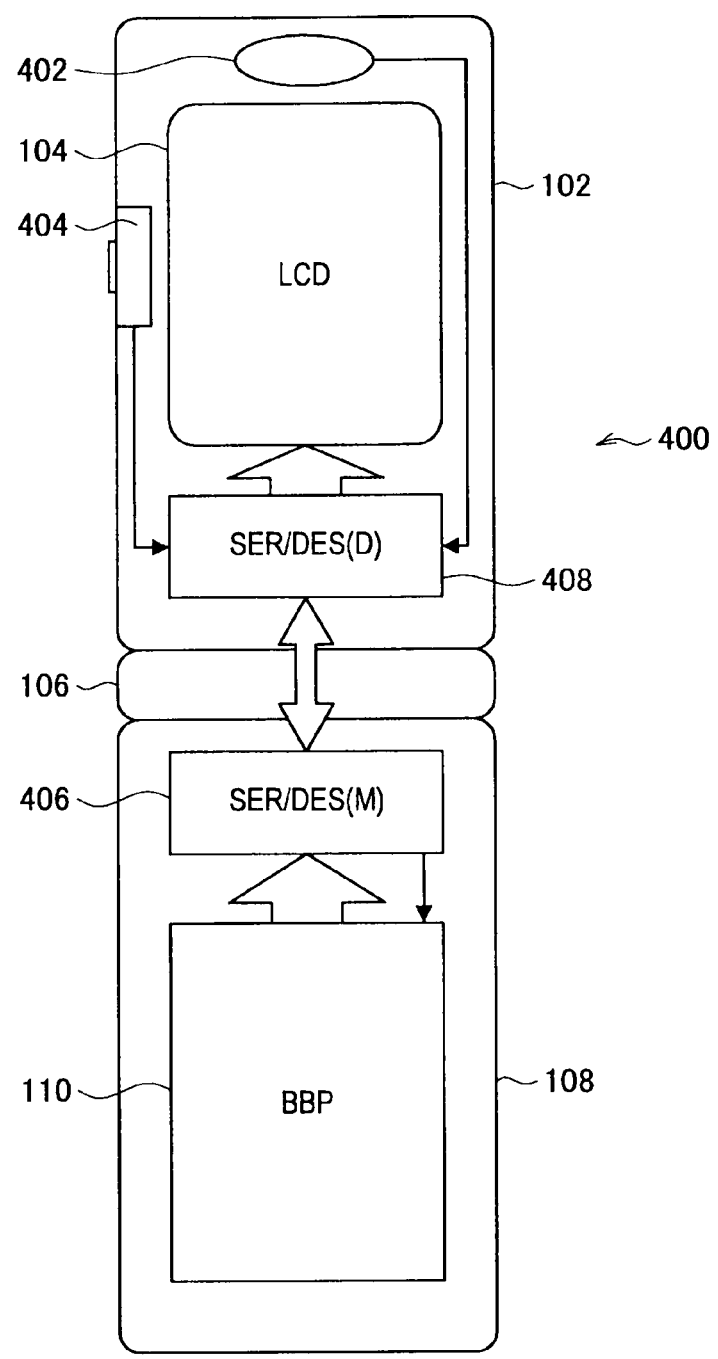
FIG. 15 is an explanatory view illustrating a configuration example of the mobile terminal involved in the extended system.
Figure 16:
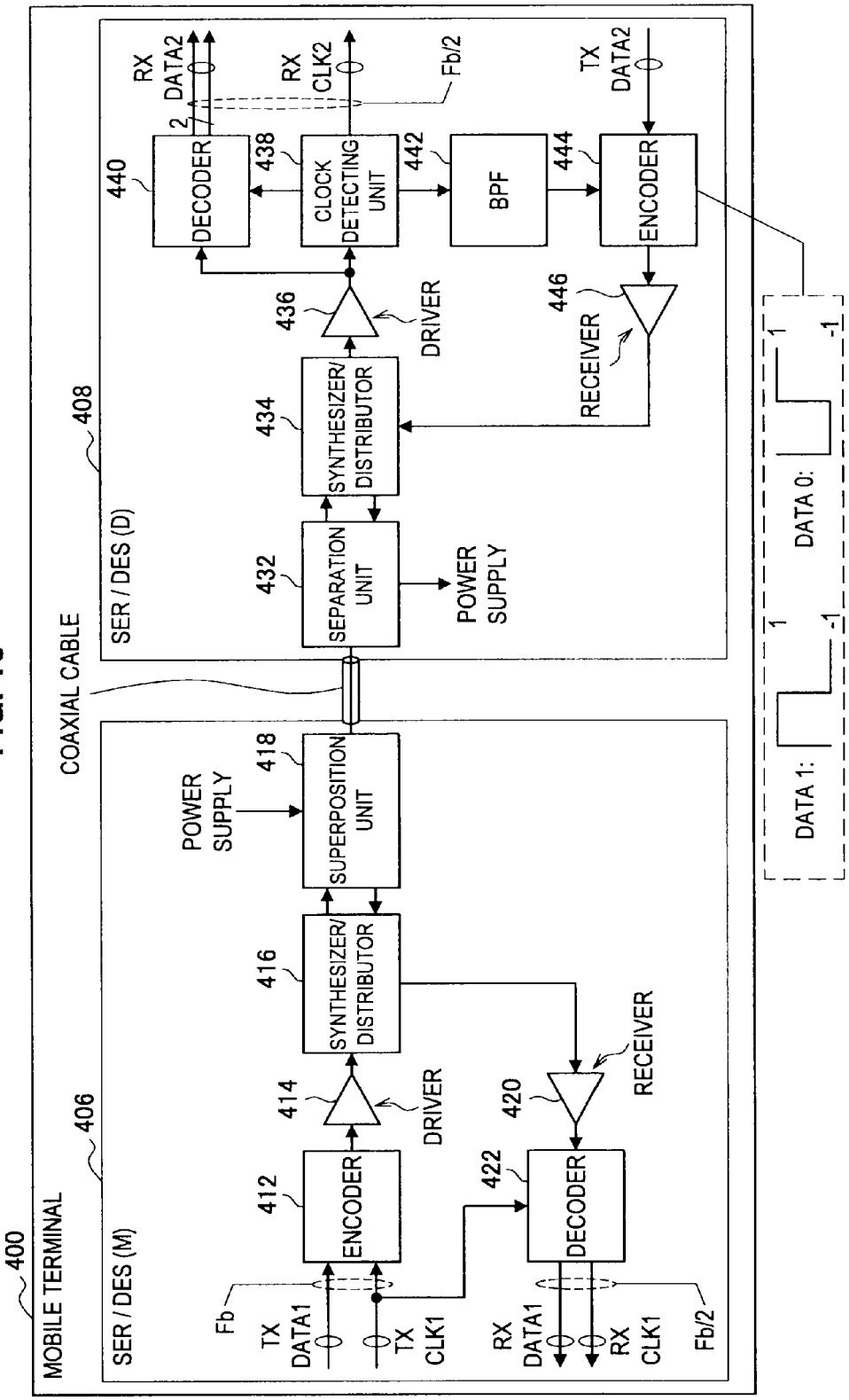
FIG. 16 is an explanatory view illustrating a functional configuration example of the mobile terminal involved in the extended system.

A functional configuration of a mobile terminal 400 involved in the extended system will be described with reference to FIGS. 14 to 16. FIG. 14 is an explanatory view illustrating an appearance of the mobile terminal 400 involved in the extended system. FIG. 15 is an explanatory view illustrating a configuration example of the mobile terminal 400 involved in the extended system. FIG. 16 is an explanatory view illustrating a functional configuration example of the mobile terminal 400 involved in the extended system. However, the substantially same functional configuration as the mobile terminals 130, 230, and 300 is designated by the same numeral, and the overlapping description is omitted.

(Need of Bidirectional Transmission)

Referring to FIG. 14, the mobile terminal 400 mainly includes the display unit 102, the connection unit 106, and the manipulation unit 108. An imaging unit 402 and a manipulation switch 404 are provided in the display unit 102. The mobile terminal 400 is an example of the configuration in which the data is bi-directionally transmitted between the display unit 102 and the manipulation unit 108. The same holds true for the configuration in which a touch panel is used in the display unit 102.

As with the mobile terminal 130 of FIG. 2, the liquid crystal unit 104 is provided in the display unit 102 of the mobile terminal 400, and the image is displayed on the liquid crystal unit 104. The image data is transmitted from the manipulation unit 108 to the display unit 102. The imaging unit 402 provided in the display unit 102 provides a camera function of taking a subject. The manipulation switch 404 provided in the display unit 102 is manipulation means for selecting a song or switching shuffle when the mobile terminal 400 is used as a music player. Sometimes the manipulation switch 404 is also used as a manner mode selector switch or a shutter switch.

The data of the image taken by the imaging unit 402 is transmitted from the display unit 102 to the manipulation unit 108. Similarly a manipulation signal output by manipulating the manipulation switch 404 is transmitted from the display unit 102 to the manipulation unit 108. Thus, in the electronic instrument such as the mobile terminal 400, the bidirectional data transmission is performed between the display unit 102 and the manipulation unit 108. Therefore, in the mobile terminal 400 of the embodiment, the transmission line passing through the connection unit 106 is serialized to realize the bidirectional data transmission while the movable range of the connection unit 106 is sufficiently ensured.

(Functional Configuration)

The functional configuration of the mobile terminal 400 involved in the extended system will be described below with reference to FIGS. 15 and 16. FIG. 15 is the explanatory view illustrating the entire configuration of the mobile terminal 400 involved in the extended system. FIG. 16 is an explanatory view illustrating a main functional configuration necessary to realize the bidirectional transmission in the functional configuration of the mobile terminal involved in the extended system.

(Entire Configuration)

Referring to FIG. 15, the liquid crystal unit 104, an imaging unit 402, a manipulation switch 404, and a serializer/deserializer 408 (SER/DES) are provided in the display unit 102 of the mobile terminal 400. The baseband processor 110 and a serializer/deserializer 406 (SER/DES) are provided in the manipulation unit 108 of the mobile terminal 400.

The mobile terminal 400 of FIG. 16 differs from the mobile terminal 130 of FIG. 2 in that the imaging unit 402 and the manipulation switch 404 are provided in the display unit 102. Additionally the mobile terminal 400 differs from the mobile terminal 130 in that the serializer 134 and deserializer 138 of the mobile terminal 130 are replaced with the serializer/deserializers 406 and 408. Hereinafter sometimes the serializer/deserializer 406 provided in the manipulation unit 108 is referred to as SER/DES(M), and the serializer/deserializer 408 provided in the display unit 102 is referred to as SER/DES(D).

(From Manipulation Unit 108 to Display Unit 102)

A flow of the signal supplied from the manipulation unit 108 to the display unit 102 will be described below. The baseband processor 110 produces the parallel signal of the image data displayed on the liquid crystal unit 104. The serializer/deserializer 406 converts the parallel signal produced by the baseband processor 110 into the serial signal. The signal serialized by the serializer/deserializer 408 is input into the serializer/deserializer 408 provided in the display unit 102 through the serial signal line passing through the connection unit 106. The serializer/deserializer 408 converts the serial signal input through the serial signal line into the parallel signal and inputs the parallel signal into the liquid crystal unit 104.

(From Display Unit 102 to Manipulation Unit 108)

A flow of the signal supplied from the display unit 102 to the manipulation unit 108 will be described below. As described above, examples of the signal supplied from the display unit 102 to the manipulation unit 108 include the signal of the image data taken by the imaging unit 402 and manipulation signal output by manipulating the manipulation switch 404. The case in which the signal of the image data taken by the imaging unit 402 is transmitted will be described here by way of example. The serializer/deserializer 408 converts the parallel signal output from the imaging unit 402 into the serial signal and inputs the serial signal to the serializer/deserializer 406 of the manipulation unit 108 through the serial transmission line passing through the connection unit 106. The serializer/deserializer 406 converts the serial signal input through the serial transmission line into the parallel signal and inputs the parallel signal into the baseband processor 110.

In the mobile terminal 400, the bidirectional data transmission is realized between the display unit 102 and the manipulation unit 108 through the above-described flows. Functional configurations of the serializer/deserializers 406 and 408 that realize the bidirectional transmission will be described in detail.

(Detailed Functional Configuration)

Referring to FIG. 16, the functional configuration of the mobile terminal 400 around the serializer/deserializer 406 and 408 is illustrated. However, part of the configuration such as the P/S conversion unit 152 illustrated in FIG. 7 (mobile terminal 300) is omitted. As with the mobile terminal 230 of FIG. 4, a configuration in which the signal is transmitted while superimposed on the direct-current power supply is adopted in the mobile terminal 400. Obviously the application range of the technique involved in the extended system is not limited to the technique in which the power supply line is used as transmission means.

As described above, the mobile terminal 400 includes the serializer/deserializer 406 (SER/DES(M)) and the serializer/deserializer 408 (SER/DES(D)). The serializer/deserializers 406 and 408 are connected by one signal line (such as a coaxial cable). The signal line is used as the power supply line through which the direct-current power supply is supplied from the manipulation unit 108 to the display unit 102. Hereinafter sometimes SER/DES(M) is simply referred to as (M), and SER/DES(D) is simply referred to as (D).

Referring to FIG. 16, the serializer/deserializer 406(M) includes an encoder 412, a driver 414, a synthesizer/distributor 416, a superposition unit 418, a receiver 420, and a decoder 422. The serializer/deserializer 408(D) includes a separation unit 432, a synthesizer/distributor 434, a receiver 436, a clock detecting unit 438, a decoder 440, a bandpass filter 442(BPF), an encoder 444, and a driver 446.

(SER/DES(M)→SER/DES(D))

Processing for transmitting data (TX DATA1) from the serializer/deserializer 406(M) to the serializer/deserializer 408(D) will be described.

As illustrated in FIG. 16, the transmitted data (TX DATA1) and a transmitted clock (TX CLK1) are input into the serializer/deserializer 406(M). It is assumed that the transmitted data (TX DATA1) is serialized at the time the transmitted data (TX DATA1) is input into the encoder 412. The transmitted clock (TX CLK1) is input into the encoder 412 and the decoder 422. When the transmitted data (TX DATA1) and the transmitted clock (TX CLK1) are input, the encoder 412 adds the transmitted clock (TX CLK1) to the transmitted data (TX DATA1) to code the transmitted data like the novel system.

When the transmitted data (TX DATA1) has the transmission rate of Fb while being expressed by the AMI code, the encoder 412 produces the code of the novel system like the code of FIG. 8C. The code produced by the encoder 412 is input into the synthesizer/distributor 416 through the driver 414. The synthesizer/distributor 416 is means for distributing the signal line leading to the encoder 412 and the signal line leading to the decoder 422 in order to realize the bidirectional transmission. In transmitting the data, the code input into the synthesizer/distributor 416 is input into the superposition unit 418.

The direct-current power supply is also input into the superposition unit 418. The code input into the superposition unit 418 is superimposed on the direct-current power supply. The superimposed signal produced by the superposition unit 418 is input into the separation unit 432 of the serializer/deserializer 408(D) through the coaxial cable. The separation unit 432 separates the input superimposed signal into the direct-current power supply and the code. The direct-current power supply separated by the separation unit 432 is supplied to the display unit 102.

On the other hand, the code by the separation unit 432 is input into the synthesizer/distributor 434. The synthesizer/distributor 434 is means for distributing the signal line leading to the decoder 440 and the signal line leading to the encoder 444 in order to realize the bidirectional transmission. In receiving the data, the code input into the synthesizer/distributor 434 is input into the clock detecting unit 438 and the decoder 440 through the receiver 436. The clock detecting unit 438 detects the clock from the input code. At this point, the clock detecting unit 438 detects the clock by the same method as the clock detecting unit 332 of the mobile terminal 300.

The clock detected by the clock detecting unit 438 is input into the decoder 440 while supplied to the liquid crystal unit 104. However, a clock (RX CLK2) detected by the clock detecting unit 438 has a frequency of Fb/2. The decoder 440 utilizes the clock (RX CLK2) input from the clock detecting unit 438 and produces received data (RX DATA2) by performing decoding processing to the input code. The received data (RX DATA2) is two-bit parallel received data that is synchronized with the clock (RX CLK2) detected by the clock detecting unit 438. Thus, the received data (RX DATA2) produced by the decoder 440 is input into the liquid crystal unit 104.

The processing for transmitting the data (TX DATA1) from the serializer/deserializer 406(M) to the serializer/deserializer 408(D) is described above. Then processing for transmitting the data (TX DATA2) from the serializer/deserializer 408(D) to the serializer/deserializer 406(M) will be described.

(SER/DES(D)→SER/DES(M))

As described above, in order to transmit the data (TX DATA2) from the serializer/deserializer 408(D) to the serializer/deserializer 406(M), a transmitted clock is necessary on the side of the serializer/deserializer 408(D). However, the power consumption is increased when the PLL circuit is provided on the side of the serializer/deserializer 408(D) to produce the transmitted clock.

Therefore, in the extended system, the transmitted clock is supplied from the serializer/deserializer 406(M) to the serializer/deserializer 408(D). A Time Division Duplex (TDD)

system is adopted to transmit the data between the serializer/deserializers 406 and 408. Accordingly, a time slot is divided into the case in which the data is transmitted forward from the serializer/deserializer 406(M) to the serializer/deserializer 408(D) and the case in which the data is transmitted in the opposite direction.

The code of FIG. 8C is used in the data transmission from the serializer/deserializer 406(M) to the serializer/deserializer 408(D). The serializer/deserializer 406(M) continuously transmits the clock signal of FIG. 8B to serializer/deserializer 408(D) even in a period of time in which the serializer/deserializer 406(M) does not transmit the data. That is, even in the period of time in which the serializer/deserializer 408 (D) transmits the data, the clock signal having the frequency (Fb/2) and the amplitude (2, −2) is continuously transmitted to the serializer/deserializer 408(D).

Therefore, the deserializer/deserializer 408(D) transmits the data by utilizing the clock signal received from the serializer/deserializer 406(M) in transmitting data. The clock signal transmitted from the serializer/deserializer 406(M) is input into the clock detecting unit 438 through the separation unit 432, the synthesizer/distributor 434, and the receiver 436. The clock detecting unit 438 detects the clock from the input signal to input the clock into the bandpass filter 442. Because usually many jitters are included in the clock detected by the clock detecting unit 438, the clock detected by the clock detecting unit 438 is input into the bandpass filter 442 in order to suppress the jitters.

The clock in which the jitters are suppressed by the bandpass filter 442 is input into the encoder 444. The transmitted data (TX DATA2) is input into the encoder 444. The encoder 444 codes the transmitted data (TX DATA2) by a predetermined system. However, the transmission line through which the transmitted data (TX DATA2) is transmitted is shared by the transmission line through which the clock signal is transmitted from the serializer/deserializer 406. Therefore, it is necessary that the transmitted data (TX DATA2) be coded so as to be synchronized with the clock output from the bandpass filter 442. In cases where the clock signal of FIG. 8B is input, the transmitted data (TX DATA2) is coded such that a component of the frequency of Fb/2 is synchronized with the clock signal.

For example, in the case of the transmitted data (TX DATA2) of 1, the encoder 444 outputs an upwardly-convex pulse having the amplitude (1,−1) for one period. In the case of the transmitted data (TX DATA2) of 0, the encoder 444 outputs a downwardly-convex pulse having the amplitude (1,−1) for one period. At this point, a pulse sequence corresponding to the transmitted data (TX DATA2) has the frequency of Fb/2. Thus, the transmitted data (TX DATA2) is coded into the pulse sequence having the amplitude (1,−1). The transmitted data (TX DATA2) coded by the encoder 444 is input into the synthesizer/distributor 434 through the driver 446.

The synthesizer/distributor 434 adds the code having the amplitude (1,−1) input from the encoder 444 and the clock having the amplitude (2,−2). The code having the amplitude (2,−2) is transmitted from the serializer/deserializer 406(M). The code added by the synthesizer/distributor 434 has the amplitude (3,−3) in the case of the transmitted data (TX DATA2) of 1, and the code has the amplitude (1,−1) in the case of the transmitted data (TX DATA2) of 0. The code produced by the synthesizer/distributor 434 is delivered to the coaxial cable through the separation unit 432 and is transmitted to the serializer/deserializer 406(M).

In the serializer/deserializer 406(M), the code of the transmitted data (TX DATA2) transmitted through the coaxial cable is input into the decoder 422 through the superposition unit 418, the synthesizer/distributor 416, and the receiver 420. The decoder 422 decodes the data based on the amplitude value of the input code. For example, in the case of the amplitude value of (3,−3), it is determined that the data has the bit value of 1. In the case of the amplitude value of (1,−1), it is determined that the data has the bit value of 0. At this point, the decoder 422 decodes the data using the transmitted clock (TX CLK1) used in transmitting the transmitted data (TX DATA1).

The clock used for the data transmission by the serializer/deserializer 408(D) is transmitted clock transmitted from the serializer/deserializer 406(M). Therefore, it is not necessary that the decoder 422 detect the clock from the input code. The data (RXDATA1) decoded by the decoder 422 and the clock (RXCLK1) are input into the baseband processor 110.

The processing for transmitting the data (TXDATA2) from the serializer/deserializer 408(D) to the serializer/deserializer 406(M) is described above. Thus, the data transmission from the serializer/deserializer 408(D) to the serializer/deserializer 406(M) is realized without the use of PLL.

(Data Transmission Method)

Figure 17:
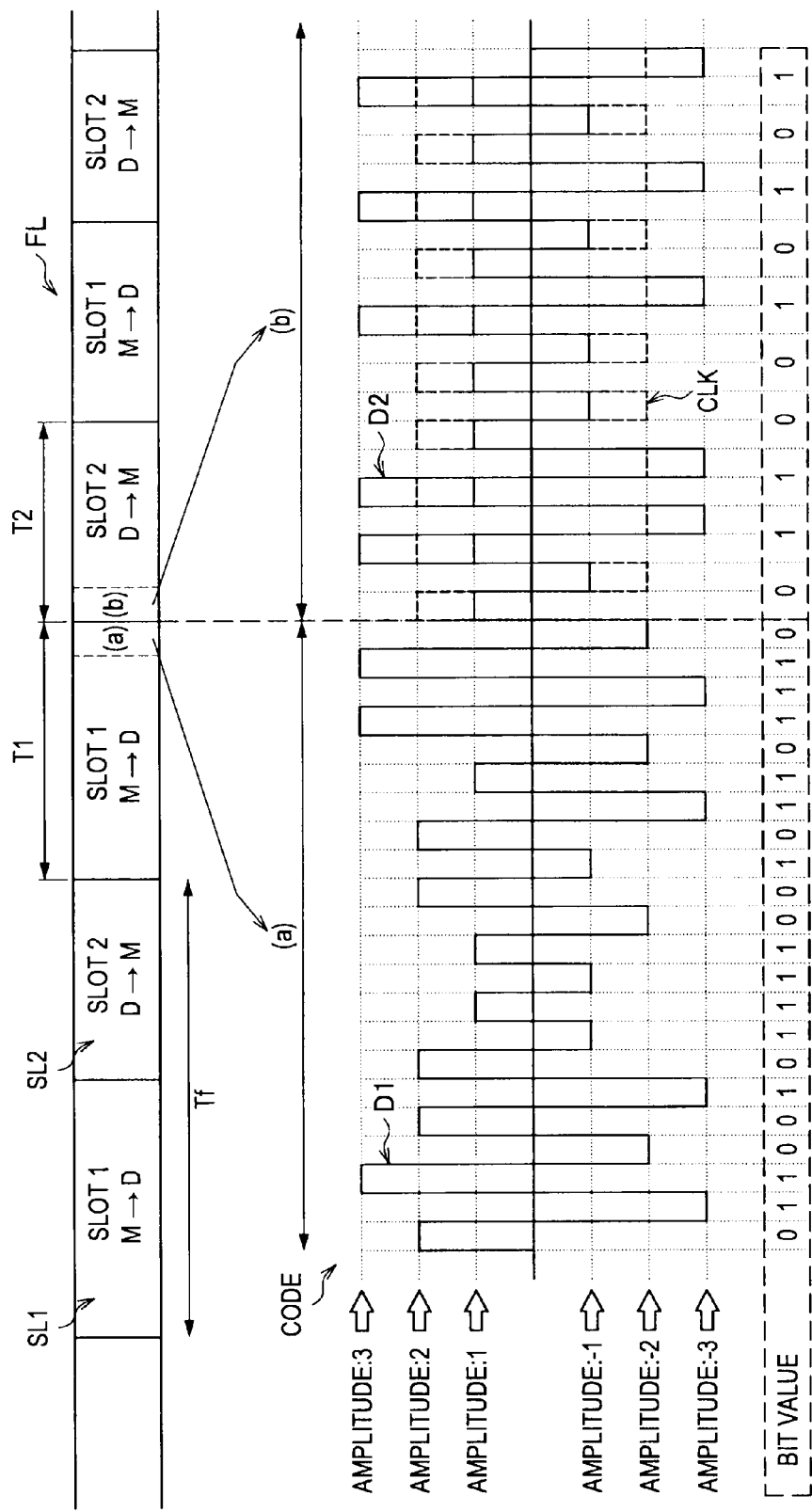
FIG. 17 is an explanatory view illustrating an example of a signal transmission method involved in the extended system.

The data transmission method involved in the extended system will be described with reference to FIG. 17. FIG. 17 is an explanatory view illustrating an example of a signal transmission method involved in the extended system.

FIG. 17 illustrates a data frame FL transmitted between the serializer/deserializers 406 and 408 by the TDD (Time Division Duplex) system. The data frame FL includes a time slot 1 (SL1; M→D) for transmitting the data from the serializer/deserializer 406(M) to the serializer/deserializer 408(D). The data frame FL also includes a time slot 2 (SL2; D→M) for transmitting the data from the serializer/deserializer 408(D) to the serializer/deserializer 406(M).

The data frame FL has a frame length Tf. The frame length Tf is determined based on the transmission rate that is necessary in each transmission direction (M→D, D→M). A period of time T1 is allocated to the time slot 1 (SL1; M→D), and a period of time T2 is allocated to the time slot 2 (SL2; D→M). For example, a relationship of T1>T2 holds in cases where the amount of image data taken by the imaging unit 402 is smaller than the amount of image data displayed on the liquid crystal unit 104.

FIG. 17 illustrates enlarged code transmitted in parts (a) and (b) of the time slots 1 and 2. In the part (a) of the time slot 1, a code D1 is transmitted from the serializer/deserializer 406(M) from the serializer/deserializer 408(D). Therefore, the code D1 transmitted in the period of time (a) is the code of the novel system of FIG. 8C and has six amplitude values. The bit value corresponding to the amplitude value of each bit interval in the code D1 is illustrated below the code D1.

On the other hand, in the part (b) of the time slot 2, a code D2 is transmitted from the serializer/deserializer 408(D) to the serializer/deserializer 406(M). A clock CLK is illustrated in FIG. 17 along with the code D2. The clock CLK is transmitted from the serializer/deserializer 406(M). Accordingly, the clock CLK is the clock having the transmission rate of Fb/2. As described above, the code D2 is produced by synchronously-adding the clock CLK to the code expressed by the pulses having amplitudes (1,−1) whose convex directions are different from each other. At this point, in the added clock CLK, the jitters are suppressed by the bandpass filter 442.

The data is transmitted from the serializer/deserializer 406 (M) to the serializer/deserializer 408(D) at the rate of Fb. However, because the clock obtained by the encoder 444 has the transmission rate of Fb/2, the data is transmitted from the serializer/deserializer 408(D) to the serializer/deserializer 406(M) at the rate of Fb/2. The bit value corresponding to each bit interval is illustrated below the code D2. It is found that the code D2 has the transmission rate of Fb/2 by referring simultaneously to the bit value and the clock CLK.

However, in the period of time of the time slot 2, the clock transmitted from the serializer/deserializer 406(M) is set to the transmission rate of Fb, which allows the code D2 to be set to the transmission rate of Fb. The reason why the clock has the transmission rate of Fb/2 is that the clock used in the process for producing the code D1 transmitted in the period of time of the time slot 1 is continuously transmitted to the serializer/deserializer 408(D). Therefore, in each time slot, it is not necessary to change the frequency of the clock generated in the deserializer/deserializer 406(M). Accordingly, the clock rate used in the data transmission of the time slot 2 may be appropriately changed depending on the situation.

(Organization of Problem 3)

The signal transmission method involved in the extended system is described above. In the extended system, the TDD system is used in the data transmission between the side of the manipulation unit 108 and the side of the display unit 102. Irrespective of the transmission direction, the clock is provided from the side (serializer/deserializer 406(M)) of the manipulation unit 108 to the side (serializer/deserializer 408 (D)) of the display unit 102. The data is transmitted from the side (serializer/deserializer 408(D)) of the display unit 102 using the clock. Therefore, it is not necessary to provide PLL on the side (serializer/deserializer 408(D)) of the display unit 102, so that the power consumption can be reduced by the part that PLL is not mounted while the bidirectional transmission is realized through the serial transmission line.

However, because the TDD system is adopted, the duplex transmission is not completely performed, and the transmission rate is lowered according to a transmission ratio in each transmission direction. The amount of data transmitted from the display unit 102 to the manipulation unit 108 is not so large in the mobile telephone. However, because the amount of data transmitted from the manipulation unit 108 to the display unit 102 is increased with increasing density of the liquid crystal unit 104 and with enhancing frame rate, there is a need to enhance the transmission rate as much as possible. Therefore, in the later-mentioned embodiment, not the TDD system, but the technique of multiplexing the bidirectionally-transmitted signals on a time axis to realize the complete duplex transmission is proposed.

4. Embodiment

An embodiment of the invention will be described below. The embodiment relates to a system in which the signal transmitted from the manipulation unit 108 to the display unit 102 and the signal transmitted from the display unit 102 to the manipulation unit 108 are transmitted while synchronously synthesized in order to solve the technical problem of Organization of Problem 3. The embodiment also relates to a technique of extracting the signal transmitted from the other side by subtracting the own transmitted signal from the signal that is transmitted while synchronously synthesized in the display unit 102 and the manipulation unit 108. The technique of coding the transmitted data by the novel system is also adopted in the embodiment. Therefore, in the embodiment, the transmitted signal can be transmitted while added to the direct-current power supply, and the clock can be reproduced without providing PLL on the reception side.

4-1. Functional Configuration of Mobile Terminal 500

First a functional configuration of a mobile terminal 500 of the embodiment will be described with reference to FIG. 18.

Figure 18:
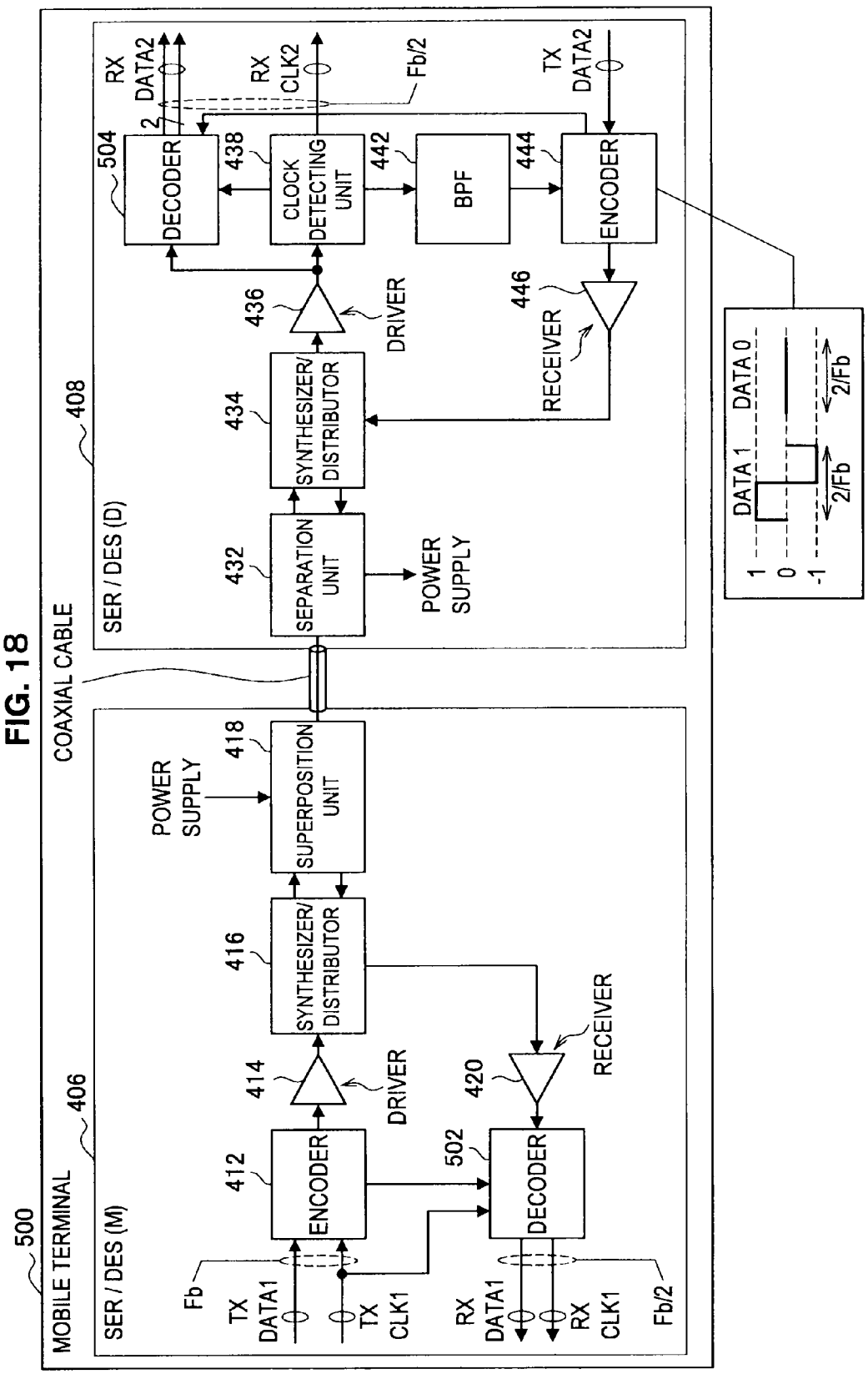
FIG. 18 is an explanatory view illustrating a configuration example of a mobile terminal according to an embodiment of the invention.

FIG. 18 is an explanatory view illustrating the functional configuration of the mobile terminal 500 according to the embodiment. FIG. 18 is an explanatory view illustrating the main functional configuration necessary to realize the duplex transmission in the functional configuration of the mobile terminal 500 of the embodiment. Accordingly, other components included in the mobile terminal 400 may be added. However, the substantially same functional configuration as the mobile terminal 400 is designated by the same numeral, and the overlapping description is omitted.

Referring to FIG. 18, the mobile terminal 500 includes the serializer/deserializer 406 (SER/DES(M)) and the serializer/deserializer 408 (SER/DES(D)). The serializer/deserializers 406 and 408 are connected by the one signal line (such as coaxial cable). The signal line is also used as the power supply line through which the direct-current power supply is supplied from the manipulation unit 108 to the display unit 102. The serializer/deserializers 406 and 408 of the mobile terminal 500 have the configuration similar to those of the mobile terminal 400.

The serializer/deserializer 406(M) includes the encoder 412, the driver 414, the synthesizer/distributor 416, the superposition unit 418, the receiver 420, and a decoder 502. The serializer/deserializer 408(D) includes the separation unit 432, the synthesizer/distributor 434, the receiver 436, the clock detecting unit 438, a decoder 504, the bandpass filter 442 (BPF), the encoder 444, and the driver 446. The mobile terminal 500 differs from the mobile terminal 400 in the functional configurations of the decoders 502 and 504. The mobile terminal 500 differs also from the mobile terminal 400 in that the transmitted signal is input from the encoder 412 into the decoder 502 and the transmitted signal is input from the encoder 444 into the decoder 504.

(SER/DES(M)→SER/DES(D))

First the processing for transmitting the data (TX DATA1) from the serializer/deserializer 406(M) to the serializer/deserializer 408(D) will be described. In the embodiment, because the duplex transmission of the data is performed, the data is received while the data is transmitted. For the sake of convenience, the processing for transmitting the data from the serializer/deserializer 406(M) to the serializer/deserializer 408(D) and the processing for transmitting the data from the serializer/deserializer 408(D) to the serializer/deserializer 406(M) are separated from each other. However, it is noted that the pieces of processing are not separated on the time axis.

As illustrated in FIG. 18, the transmitted data (TX DATA1) and the transmitted clock (TX CLK1) are input into the serializer/deserializer 406(M). It is assumed that the transmitted data (TX DATA1) is serialized at the point when input into the encoder 412. The transmitted clock (TX CLK1) is input into the encoder 412 and the decoder 502. When the transmitted data (TX DATA1) and the transmitted clock (TX CLK1) are input, the encoder 412 codes the transmitted data by adding transmitted clock (TX CLK1) to the transmitted data (TX DATA1) like the novel system.

When the transmitted data (TX DATA1) has the transmission rate of Fb while being expressed by the AMI code, the encoder 412 produces the code similar to that of the FIG. 8C by the novel system. The code produced by the encoder 412 is input into the synthesizer/distributor 416 through the driver 414. At this point, the code produced by the encoder 412 is also input into the decoder 502. The code input into the decoder 502 is used in decoding the received data. The code input into the synthesizer/distributor 416 is input into the superposition unit 418.

The direct-current power supply is input into the superposition unit 418 along with the code that is input from the encoder 412 through the synthesizer/distributor 416. The code input into the superposition unit 418 is superimposed on the direct-current power supply. The superimposed signal produced by the superposition unit 418 is input into the separation unit 432 of the serializer/deserializer 408(D) through the coaxial cable. The separation unit 432 separates the input superimposed signal into the direct-current power supply and the code. The direct-current power supply separated by the separation unit 432 is supplied to the display unit 102.

On the other hand, the code separated by the separation unit 432 is input into the synthesizer/distributor 434. The code input into the synthesizer/distributor 434 is input into the clock detecting unit 438 and the decoder 504 through the receiver 436. The clock detecting unit 438 detects the clock from the input code. At this point, as with the clock detecting unit 332 included in the mobile terminal 300, the clock detecting unit 438 detects the clock based on the polarity inversion period of the code.

The clock detected by the clock detecting unit 438 is input into the decoder 504 while supplied to the liquid crystal unit 104. However, the clock (RX CLK2) detected by the clock detecting unit 438 has the frequency of Fb/2. The decoder 504 performs the decoding processing to the input code to produce the received data (RX DATA2) by utilizing the clock (RX CLK2) input from the clock detecting unit 438. However, in cases where the duplex transmission of the data is performed between the serializer/deserializer 408(D) and the serializer/deserializer 406(M), the signals are multiplexed in the coaxial cable. Therefore, it is necessary that the decoder 504 separate the code of the received data.

The encoder 444 inputs the code of the transmitted data into the decoder 504 in order to separate the received data. The decoder 504 subtracts the code of the transmitted data input by the encoder 444 from the code input through the synthesizer/distributor 434 and the receiver 436. The decoder 504 performs the decoding processing to the code of the received data extracted through the subtraction processing to produce the received data (RX DATA2) by utilizing the clock (RX CLK2) input from the clock detecting unit 438. The received data (RX DATA2) is the two-bit parallel received data that is synchronized with the clock (RX CLK2) detected by the clock detecting unit 438. The received data (RX DATA2) decoded by the decoder 504 is input into the liquid crystal unit 104.

The processing for transmitting the data (TX DATA1) from the serializer/deserializer 406(M) to the serializer/deserializer 408(D) is described above. Then the processing for transmitting the data (TX DATA2) from the serializer/deserializer 408(D) to the serializer/deserializer 406(M) will be described.

(SER/DES(D)→SER/DES(M))

For example, the code that does not include the direct-current component as illustrated in FIG. 18 is used to transmit the data from the serializer/deserializer 408(D) to the serializer/deserializer 406(M). The serializer/deserializer 408(D) transmits the data by utilizing the clock detected by the clock detecting unit 438. In the embodiment, it is assumed that always the signal including the clock or only the clock is transmitted from the serializer/deserializer 406(M) to the serializer/deserializer 408(D).

As described above, the clock detecting unit 438 detects the clock based on the polarity inversion period of the input code. The code detected by the clock detecting unit 438 is input into the encoder 444 through the bandpass filter 442. The code is caused to pass through the bandpass filter 442 to suppress the jitters included in the clock. The transmitted data (TX DATA2) is input into the encoder 444 in addition to the clock. The encoder 444 codes the transmitted data (TX DATA2) by a predetermined system. As illustrated in FIG. 18, a system for coding the transmitted data (TX DATA2) into the code (such as the ASK code) that does not include the direct-current component is used as the predetermined system.

For example, the transmitted data (TX DATA2) has the amplitude (1,−1) in the case of the data 1, and the transmitted data (TX DATA2) is coded by a code having the amplitude of 0 in the case of the data 0. The transmitted data (TX DATA2) is coded so as to be synchronized with the clock output from the bandpass filter 442. In cases where the clock signal of FIG. 8B is input, the transmitted data (TX DATA2) is coded such that the component of the frequency of Fb/2 is synchronized with the clock. The transmitted data (TX DATA2) coded by the encoder 444 is input into the synthesizer/distributor 434 through the driver 446.

In the synthesizer/distributor 434, the code having the amplitude (1,0,−1) input from the encoder 444 and the code transmitted from the serializer/deserializer 406(M) are synchronously added while the edges are matched with each other. The code synchronously added by the synthesizer/distributor 434 is transmitted to the serializer/deserializer 406(M) through the coaxial cable. The code transmitted through the coaxial cable is input into the decoder 502 through the superposition unit 418, synthesizer/distributor 41, and receiver 420, which are included in the serializer/deserializer 406(M).

The decoder 502 decodes the data based on the amplitude value of the input code. However, the input code includes the code of the transmitted data transmitted by the serializer/deserializer 406(M). Therefore, the decoder 502 subtracts the code of the transmitted data input from the encoder 412 from the received code, thereby extracting the code of the transmitted data transmitted by the serializer/deserializer 408(D). Then the decoder 502 decodes the data from the extracted code by utilizing the transmitted clock (TX CLK1) used to transmit the transmitted data (TX DATA1). The data (RX DATA1) decoded by the decoder 502 is input into the baseband processor 110.

The processing for transmitting the data (TX DATA2) from the serializer/deserializer 408(D) to the serializer/deserializer 406(M) is described above. Thus, the code is transmitted in the transmission path while multiplexed, and the code of the transmitted data is subtracted on each side, which allows the duplex transmission to be performed between the serializer/deserializer 408(D) and the serializer/deserializer 406(M). In the case of the duplex transmission, the data transmission from the serializer/deserializer 408(D) to the serializer/deserializer 406(M) is realized without the use of PLL.

4-2. Duplex Transmission Code

Figure 19:
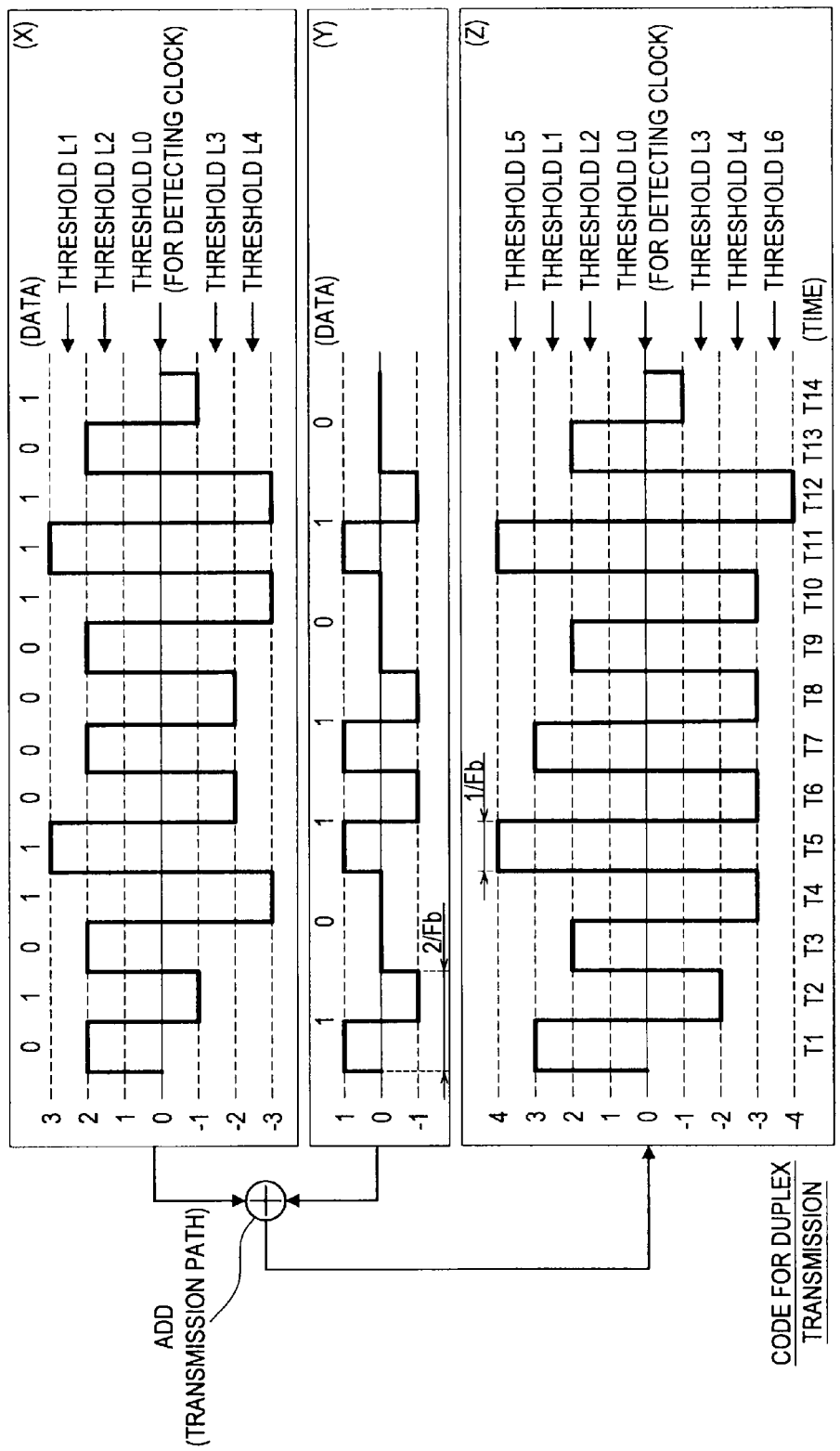
FIG. 19 is an explanatory view illustrating an example of a code for duplex transmission of the embodiment.

A waveform of the code for duplex transmission in the transmission path and the decoding method performed by the decoders 502 and 504 will be described with reference to FIG. 19. FIG. 19 is an explanatory view illustrating an example of the code for duplex transmission of the embodiment.

A code (X) of FIG. 19 is coded by the coding method of the novel system. For example, the code (X) is produced by the encoder 412 and transmitted to the serializer/deserializer 408 (D). In the code, the data 1 is expressed by the plurality of potentials A1 (−1, −3, 1, 3), and the data 0 is expressed by the plurality of potentials A2 (−2, 2) that are different from the potentials A1. The code is formed such that the polarity is inverted in each half the period of the clock, and the code is formed such that the same potentials do not appear continuously. That is, the code (X) has the same shape as the code of FIG. 8C.

A code (Y) of FIG. 19 is produced by the encoder 444 and transmitted to the serializer/deserializer 406(M). Usually the amount of data transmitted from the display unit 102 to the manipulation unit 108 is smaller than the amount of data transmitted from the manipulation unit 108 to the display unit 102. Therefore, it is assumed that the transmission rate of the code transmitted to the serializer/deserializer 406(M) is set to the transmission rate of Fb/2 that is slower than the transmission rate of Fb of the code (X).

It is assumed that the code (Y) has a waveform in which the data 1 is expressed by the two-bit amplitude (1,−1) while the data 0 is expressed by the amplitude 0. The code can be regarded as the ASK code. A spectrum of the code (Y) has the shape similar to that of FIG. 9. That is, the spectrum of the code (Y) does not have the direct-current component, but the code (Y) has the line spectrum at the frequency of Fb/2, and the code (Y) becomes null at the frequency of Fb. As described above, the code (Y) is transmitted to the serializer/deserializer 406(M) while synchronously multiplexed on the code (X).

The code (X) and the code (Y) are transmitted through the same transmission path. Therefore, in the transmission path, the code (X) and the code (Y) are added and changed into a signal of a code (Z). In the code (Z), an absolute value of the maximum amplitude is widened by one compared with the code (X), and the signal has eight amplitude values 4, 3, 2, 1, −1, −2, −3 and −4. For example, an eye pattern of the received signal corresponding to the code (Z) becomes a waveform of FIG. 21. As illustrated in FIG. 21, it is found that the level is increased by one in positive and negative amplitudes.

Accordingly, in order to determine each amplitude value of the code (Z), it is necessary to provide seven thresholds L0 to L6. However, the thresholds L0 to L4 are used to determine the amplitude value of the code (X) (see FIG. 8). The thresholds L5 and L6 are newly provided. As with the code (X), the code (Z) strides the amplitude value of 0 in the positive and negative direction in each of 1/Fb. Therefore, the clock can be detected by determining the code (Z) using the threshold L0.

A circuit configuration of the decoders 502 and 506 used to determine the data value corresponding to each amplitude value of the code (Z), code (X), and code (Y) will be described with reference to FIG. 20. FIG. 20 is an explanatory view illustrating an example of a determining circuit that determines each amplitude value of the code (X) and code (Y) to decode the data. However, in cases where the circuit configuration is applied to the decoder 502, it is not necessary to provide the comparator 532 that extracts the clock.

As illustrated in FIG. 20, a comparator 532 for extracting the clock and six comparators 534, 536, 538, 540, 542, and 544 for extracting the data are provided in the determining circuit. An operational circuit 546 is also provided in the determining circuit. The operational circuit 546 converts the output signals of the comparators 534, 536, 538, 540, 542, and 544 into the amplitude values and subtracts the amplitude value of the code (Y) or code (X) from the amplitude value. A determination circuit 548 is also provided in the determining circuit. The determination circuit 548 determines the data of the code (X) or code (Y) based on the output result of the operational circuit 546.

The code (Z) is input as the received data into the comparator 532. As described above, the comparator 532 is provided to extract the clock from the code (Z). The threshold L0 is set to the comparator 532 in order to extract the clock. Therefore, when the code (Z) is input into the comparator 532, the polarity inversion period of the code (Z) is detected to output the clock component. The clock component output from the comparator 532 is input into the operational circuit 546 and the determination circuit 548. In cases where the determining circuit is applied to the decoder 502, because the clock used in producing the code (X) is input into the decoder 502, the comparator 532 for extracting the clock is unnecessary.

The code (Z) is input into the comparators 534, 536, 538, 540, 542, and 544 for extracting data. The thresholds L1, L2, L3, L4, L5, and L6 for extracting data are set to the comparators 534, 536, 538, 540, 542, and 544, respectively. The comparators 534, 536, 538, 540, 542, and 544 compare the thresholds L1, L2, L3, L4, L5, and L6 for extracting data and the amplitude of the code (Z) and input the comparison result into the operational circuit 546. The operational circuit 546 converts the output results of the comparators 534, 536, 538, 540, 542, and 544 into the eight amplitude values 4, 3, 2, 1, −1, −2, −3, and −4.

The amplitude value of the code (X) or code (Y) that is of the transmitted data is input from the encoder 412 or encoder 444 into the operational circuit 546. At this point, the operational circuit 546 subtracts the amplitude value of the input code (X) or code (Y) from the amplitude value of the code (Z) obtained through the conversion processing. In the case of the application to the decoder 502, the amplitude value of the code (X) is subtracted from the amplitude value of the code (Z), and the amplitude value of the code (Y) is output. On the other hand, in the case of the application to the decoder 504, the amplitude value of the code (Y) is subtracted from the amplitude value of the code (Z), and the amplitude value of the code (X) is output.

The amplitude value output from the operational circuit 546 is input into the determination circuit 548. The determination circuit 548 performs processing for converting the amplitude value output from the operational circuit 546 into the data value 0 or 1. As described above, the data value 1 is allocated to the amplitude values −3, −1, 1, and 3 of the code (X), and the data value 0 is allocated to the amplitude values −2 and 2 of the code (X). On the other hand, the data value 1 is allocated to the amplitude values −1 and 1 of the code (Y), and the data value 0 is allocated to the amplitude value 0 of the code (Y). Therefore, the determination circuit 548 converts the amplitude value into the data value based on a predetermined coding rule. The data value converted by the determination circuit 548 is output as decoded data.

Referring to FIG. 19, as described above, the amplitude value of the code (Z) is determined using the threshold, and the amplitude value of the code (X) or code (Y) corresponding to the transmitted data is subtracted from the determination result, which allows the extraction of the amplitude value of the code (Y) or code (X) corresponding to the received data. Thus, the subtraction processing may be performed not at an analog level but at a digital level. That is, the inverse processing of the synchronous addition process of FIG. 19 may be performed. The desired data value can easily be detected from the result obtained by performing the subtraction processing.

The functional configuration of the mobile terminal 500 of the embodiment, the configuration of the code for duplex transmission, the data coding method, and the data decoding method are described above. In the embodiment, on the assumption that the signal transmitted from the manipulation unit 108 to the display unit 102 and the signal transmitted from the display unit 102 to the manipulation unit 108 are multiplexed in the transmission path, and the bidirectional data transmission is simultaneously realized. As a result, the transmission rate degradation that is the problem in the time division transmission system is not generated, and the high-speed data transmission is realized.

4-3. Summary

Finally the functional configuration of the mobile terminal of the embodiment and the effect obtained by the functional configuration are briefly summarized.

The functional configuration of the mobile terminal of the embodiment can be expressed as follows. The mobile terminal includes a first module corresponding to the manipulation unit 108 and a second module corresponding to the display unit 102.

The first module includes a first data signal producing unit that codes the first transmitted data into a waveform to produce the first data signal. In the waveform, the direct-current component is not included and the polarity is inverted in each half the period of the clock. As described above, the first data signal does not include the direct-current component, so that the first data signal can be transmitted while superimposed on the power signal supplied from the direct-current power supply. The first data signal includes the clock component whose polarity is inverted. Therefore, the clock can be reproduced without the use of PLL by detecting the polarity inversion period included in the first data signal.

The first module includes a first signal sending unit that sends the first data signal to the second module. For example, the first signal sending unit is means for sending the first data signal to the second module connected through one coaxial cable. The first module includes the signal subtracting unit that subtracts the first data signal from the signal received from the second module. When the second module transmits another signal through the transmission path while multiplexing another signal to the first data signal sent by the first signal sending unit, the signal subtracting unit extracts another signal from the multiple signals. The first module includes the signal subtracting unit, so that another signal can be transmitted from the second module in the multiplex manner while the first data signal is sent. The signal subtracting unit may subtract the digital data of the first data signal from the digital data of the signal received from the second module.

On the other hand, the second module includes the clock detecting unit that detects the clock based on the polarity inversion period of the first data signal received from the first module. As described above, the first data signal includes the clock component whose polarity is inverted. Therefore, the clock detecting unit detects the polarity inversion period, which allows the clock to be reproduced without the use of PLL by the second module. The second module includes a second data signal producing unit coding the second transmitted data into a waveform that does not include the direct-current component using the clock detected by the clock detecting unit, thereby producing the second data signal. The first data signal producing unit is means for producing the second data signal that is transmitted while multiplexed to the first data signal in transmitting the first data signal from the first module. As described above, the second data signal includes the waveform that does not include the direct-current component. Therefore, the second data signal can be multiplexed in the transmission line, even in cases where the first data signal is transmitted through the transmission line such as the power supply line of the direct-current signal.

The second module includes a second signal sending unit that sends the second data signal to the first module while the second data signal is synchronously added to the first data signal sent from the first module. The information processing apparatus is intended to realize the duplex transmission between the first and second modules. Therefore, the first and second data signals are transmitted while multiplexed in the transmission path. Obviously, in both the first and second modules, it is necessary to extract the received signal from the multiple signals. Therefore, the second data signal is transmitted by the second signal sending unit while synchronized with the first data signal. As a result, the signal subtracting unit of the first module subtracts the first data signal from the signal multiplexed in the transmission path, thereby easily extracting the second data signal. In the configuration, the duplex transmission can be performed between the first and second modules to realize the bidirectional data transmission at the same time.

The first data signal producing unit may include the following data coding unit and synchronous adding unit. The data coding unit codes the first transmitted data into a code having the transmission rate of Fb to produce a coding signal. The code does not include the direct-current component. In the code, a first bit value is expressed by a plurality of first amplitude values, and a second bit value that is different from the first bit value is expressed by a second amplitude value that is different from the first amplitude value. The synchronous adding unit produces the first data signal by synchronously adding the clock to the coding signal. The clock has the transmission rate of Fb/2, and the clock has the amplitude larger than that of the coding signal. Thus, the clock is synchronously added to the code that does not include the direct-current component, thereby producing the first data signal having the waveform. As a result, the first data signal can be transmitted while superimposed on the direct current, and the clock can be reproduced without the use of PLL in the second module.

The first module may further include the signal superposition unit that produces the superimposed signal by superimposing the power signal supplied from the direct-current power supply on the first data signal. In such cases, the first signal sending unit sends the superimposed signal to the second module. The second module further includes the signal separation unit that separates the superimposed signal received from the first module into the power signal and the first data signal. As described above, because the first data signal does not include the direct-current component, the first data signal can be transmitted while superimposed on the direct current. In cases where the transmission system is adopted, the signal superposition unit is provided in the first module, and the signal separation unit is provided in the second module.

The second data signal producing unit may produce the second data signal by coding the second transmitted data into the ASK code having the transmission rate of Fb/2. The information processing apparatus may be a mobile instrument including a body unit and a display unit, which are connected by a movable member. In such cases, the first module is the body portion in which at least the arithmetic processing device is incorporated. The second module is the display unit in which at least the display screen is incorporated. Usually the arithmetic processing device of the body portion produces the image data displayed on the display screen of the display unit and transmits the image data to the display unit. On the other hand, in the display unit, sometimes another data input means is provided in addition to the display screen. However, because the amount of data transmitted from another data input means is smaller than the amount of image data, there is a little need for the high-speed data transmission. As described above, sometimes the transmission rate of the second data signal is set to Fb/2 that is half the transmission rate of Fb of the first data signal. Accordingly, frequently the first module is used as the body portion while the second module is used as the display unit.

(Remarks)

The encoder 412 is an example of the first data signal producing unit. The driver 414, the synthesizer/distributor 416, and the superposition unit 418 are examples of the first signal sending unit. The decoder 502 is an example of the signal subtracting unit. The serializer/deserializer 406 (manipulation unit 108) is an example of the first module. The encoder 444 is an example of the second data signal producing unit. The driver 446 and the synthesizer/distributor 434 are examples of the second signal sending unit. The encoder 414 is examples of the data coding unit and synchronous adding unit. The superposition unit 418 is an example of the signal superposition unit. The separation unit 432 is an example of the signal separation unit. The mobile terminal 500 is an example of the mobile instrument. The manipulation unit 108 is an example of the body portion. The connection unit 106 is an example of the movable member. The liquid crystal unit 104 is an example of the display screen. Examples of the mobile instrument include the mobile telephone, a handheld game machine, an imaging apparatus, a notebook personal computer, an electronic dictionary, a printer, a facsimile, and home information appliances. Among others, the technique of the embodiment is suitably applied to the electronic instrument, in which the movable portion is included and the power supply and data transmission are generated between at least two components connected by the movable portion.

It should be understood by those skilled in the art that various modifications, combinations, sub-combinations and alterations may occur depending on design requirements and other factors insofar as they are within the scope of the appended claims or the equivalents thereof.

For example, in the embodiment, the AMI code is used as the code input into the adder ADD. However, the technique of the invention is not limited to the AMI code. As described above, various bipolar codes and the partial response system expressed by the code PR (1,−1), PR (1,0,−1), PR (1,0, . . . ,0,−1), and the like may be adopted in the technique of the invention. The coding systems in which the polarity inversion is utilized are suitably adopted. Such codes may be produced by bit shift. Thus, various modifications can be made with respect to the code producing method.

The present application contains subject matter related to that disclosed in Japanese Priority Patent Application JP 200-284355 filed in the Japan Patent Office on 05 Nov. 2008, the entire content of which is hereby incorporated by reference.

What is claimed is:

1. An information processing apparatus comprising:
    a first module; and
    a second module,
    wherein the first module includes:
    a first data signal producing unit that produces a first data signal by coding a first transmitted data into a waveform, the waveform not including a direct-current component, a polarity of the waveform being inverted in each half period of a clock;
    a first signal sending unit that sends the first data signal to a second module; and
    a signal subtracting unit that subtracts the first data signal from a signal received from the second module, and
    the second module includes:
    a clock detecting unit that detects the clock based on the polarity inverting period of the first data signal received from the first module;
    a second data signal producing unit that produces a second data signal by coding a second transmitted data into a waveform using the clock detected by the clock detecting unit, the waveform not including the direct-current component; and
    a second signal sending unit that sends the second data signal to the first module while the second data signal is synchronously added to the first data signal sent from the first module.

2. The information processing apparatus according to claim 1, wherein the first data signal producing unit includes:
    a data coding unit that codes the first transmitted data into a code to produce a coding signal, the code having a transmission rate of Fb, the code not including the direct-current component, a first bit value being expressed by a plurality of first amplitude values, a second bit value that is different from the first bit value being expressed by a second amplitude value that is different from the first amplitude value; and
    a synchronous adding unit that produce the first data signal by synchronously adding a clock to the first data signal, the clock having a transmission rate of Fb/2 and having amplitude larger than that of the coding signal.

3. The information processing apparatus according to claim 2, wherein the second data signal producing unit produces the second data signal by coding the second transmitted data into an ASK (Amplitude Shift Keying) code having a transmission rate of Fb/2.

4. The information processing apparatus according to claim 1, wherein the first module further includes a signal superposition unit that produces a superimposed signal by superimposing a power signal supplied from a direct-current power supply on the first data signal,
    the first signal sending unit sends the superimposed signal to the second module, and
    the second module further includes a signal separation unit that separates the superimposed signal received from the first module into the power signal and the first data signal.

5. The information processing apparatus according to claim 4, wherein the information processing apparatus is a mobile instrument including a body portion and a display portion connected by a movable member,
    the first module corresponds to the body portion in which at least an arithmetic processing unit is incorporated, and
    the second module corresponds to the display portion in which at least a display screen is incorporated.

6. The information processing apparatus according to claim 1, wherein the signal subtracting unit subtracts digital data of the first data signal from digital data of the signal received from the second module.

7. A duplex transmission method, comprising the steps of:
    producing a first data signal by coding a first transmitted data into a waveform using a first module, the waveform not including a direct-current component, a polarity of the waveform being inverted in each half period of a clock;
    sending the first data signal to a second module using the first module
    detecting the clock using the second module based on the polarity inverting period of the first data signal received from the first module;
    producing a second data signal by coding a second transmitted data into a waveform with the clock detected by the clock detecting unit using the second module, the waveform not including the direct-current component;
    sending the second data signal to the first module using the second module while the second data signal is synchronously added to the first data signal sent from the first module; and
    extracting the second data signal by subtracting the first data signal from the signal received from the second module using the first module.

* * * * *